(12) United States Patent
Zhao et al.

(10) Patent No.: US 10,288,484 B2
(45) Date of Patent: *May 14, 2019

(54) HOMOGENIZATION OF LIGHT BEAM FOR SPECTRAL FEATURE METROLOGY

(71) Applicant: Cymer, LLC, San Diego, CA (US)

(72) Inventors: Zhongquan Zhao, San Diego, CA (US); Brian Edward King, San Diego, CA (US); Thomas Patrick Duffey, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/004,942

(22) Filed: Jun. 11, 2018

(65) Prior Publication Data

US 2018/0292264 A1    Oct. 11, 2018

Related U.S. Application Data

(63) Continuation of application No. 15/364,006, filed on Nov. 29, 2016, now Pat. No. 10,012,544.

(51) Int. Cl.
*G01J 1/42* (2006.01)
*G01J 3/50* (2006.01)
(Continued)

(52) U.S. Cl.
CPC ............. *G01J 3/505* (2013.01); *G01J 1/0407* (2013.01); *G01J 1/0411* (2013.01);
(Continued)

(58) Field of Classification Search
CPC ........ G01J 3/505; G01J 1/0407; G01J 1/0411; G01J 1/0474; G01J 1/0488; G01J 1/4257;
(Continued)

(56) References Cited

U.S. PATENT DOCUMENTS

| 5,025,445 A | 6/1991 | Anderson et al. |
| 5,610,733 A | 3/1997 | Feldman et al. |

(Continued)

FOREIGN PATENT DOCUMENTS

| DE | 102006009212 A1 | 8/2007 |
| TW |    201444209 A  | 11/2014 |

(Continued)

OTHER PUBLICATIONS

Office Action, counterpart Taiwanese Patent Application No. 106138363, dated Aug. 8, 2018, 8 pages total (including English translation of 4 pages).

(Continued)

*Primary Examiner* — Kiho Kim
(74) *Attorney, Agent, or Firm* — DiBerardino McGovern IP Group LLC

(57) ABSTRACT

A metrology system is used for measuring a spectral feature of a pulsed light beam. The metrology system includes: a beam homogenizer in the path of the pulsed light beam, the beam homogenizer having an array of wavefront modification cells, with each cell having a surface area that matches a size of at least one of the spatial modes of the light beam; an optical frequency separation apparatus in the path of the pulsed light beam exiting the beam homogenizer, wherein the optical frequency separation apparatus is configured to interact with the pulsed light beam and to output a plurality of spatial components that correspond to the spectral components of the pulsed light beam; and at least one sensor that receives and senses the output spatial components.

23 Claims, 12 Drawing Sheets

(51) Int. Cl.
*G01J 3/02* (2006.01)
*G01J 3/26* (2006.01)
*G01J 11/00* (2006.01)
*G03F 7/20* (2006.01)
*H01S 4/00* (2006.01)
*H01S 3/23* (2006.01)
*G01J 1/04* (2006.01)
*H01S 3/08* (2006.01)
*H01S 3/225* (2006.01)
*H01S 3/00* (2006.01)

(52) U.S. Cl.
CPC .......... *G01J 1/0474* (2013.01); *G01J 1/0488* (2013.01); *G01J 1/4257* (2013.01); *G01J 3/0205* (2013.01); *G01J 3/027* (2013.01); *G01J 3/0208* (2013.01); *G01J 3/26* (2013.01); *G01J 3/502* (2013.01); *G01J 11/00* (2013.01); *G03F 7/70041* (2013.01); *G03F 7/70075* (2013.01); *G03F 7/7085* (2013.01); *G03F 7/70575* (2013.01); *H01S 3/2308* (2013.01); *H01S 4/00* (2013.01); *H01S 3/005* (2013.01); *H01S 3/0057* (2013.01); *H01S 3/0071* (2013.01); *H01S 3/0085* (2013.01); *H01S 3/08009* (2013.01); *H01S 3/225* (2013.01)

(58) Field of Classification Search
CPC ........ G01J 3/0205; G01J 3/0208; G01J 3/027; G01J 3/26; G01J 3/502; G01J 11/00; G03F 7/70041; G03F 7/70075; G03F 7/70575; G03F 7/7085; H01S 3/2308; H01S 4/00; H01S 3/0057; H01S 3/0071; H01S 3/0085; H01S 3/08009; H01S 3/225

See application file for complete search history.

(56) References Cited

U.S. PATENT DOCUMENTS

| | | | |
|---|---|---|---|
| 6,025,938 | A | 2/2000 | Kathman et al. |
| 6,750,972 | B2 | 6/2004 | Sandstrom et al. |
| 6,894,785 | B2 | 5/2005 | Rao et al. |
| 6,912,052 | B2 | 6/2005 | Rao et al. |
| 6,952,296 | B1 | 10/2005 | Dultz et al. |
| 7,088,758 | B2 | 8/2006 | Sandstrom et al. |
| 7,639,364 | B2 | 12/2009 | Rafac |
| 7,715,459 | B2 | 5/2010 | Brown et al. |
| 7,728,954 | B2 | 6/2010 | Baselmans et al. |
| 8,148,663 | B2 | 4/2012 | Adams et al. |
| 9,599,904 | B2 * | 3/2017 | Schubert ............. G03F 7/70116 |
| 2003/0071204 | A1 | 4/2003 | Sandstrom et al. |
| 2004/0130790 | A1 | 7/2004 | Sales |
| 2005/0078367 | A1 * | 4/2005 | Kamijima ............ G02B 3/0012 359/456 |
| 2005/0286599 | A1 | 12/2005 | Rafac et al. |
| 2007/0206383 | A1 | 9/2007 | Broude et al. |
| 2010/0265482 | A1 * | 10/2010 | Schubert ............. G03F 7/70116 355/67 |
| 2011/0122385 | A1 | 5/2011 | Claessens et al. |
| 2011/0182306 | A1 | 7/2011 | Hosseini et al. |
| 2012/0162657 | A1 | 6/2012 | Rafac et al. |
| 2012/0224183 | A1 * | 9/2012 | Fay ..................... G01B 9/0209 356/491 |
| 2013/0130428 | A1 * | 5/2013 | Tekolste ................ G01J 3/18 438/70 |
| 2014/0226140 | A1 | 8/2014 | Chuang et al. |
| 2015/0355025 | A1 | 12/2015 | Duffey et al. |
| 2016/0341602 | A1 | 11/2016 | Thornes |
| 2018/0149523 | A1 | 5/2018 | Zhao et al. |

FOREIGN PATENT DOCUMENTS

| | | |
|---|---|---|
| TW | 201531798 A | 8/2015 |
| WO | 0148881 A1 | 7/2001 |
| WO | 03107494 A2 | 12/2003 |
| WO | 2005008295 A2 | 1/2005 |

OTHER PUBLICATIONS

Armen Kroyan, et al., "Effects of 95% Integral vs. FWHM Bandwidth Specifications on Lithographic Imaging," Cymer, Inc., San Diego, CA, Optical Microlithography XIV, Proceedings of SPIE vol. 4346, 2001 (10 total pages).

Robert J. Rafac, "Overcoming limitations of etalon spectrometers used for spectral metrology of DUV excimer light sources," Cymer, Inc., San Diego, CA, Optical Microlithography XVII, Proceedings of SPIE vol. 5377, 2004 (13 total pages).

Wayne J. Dunstan, et al., "Active Spectral Control of DUV light sources for OPE minimization," Cymer, Inc., San Diego, CA, Optical Microlithography XIX, Proceedings of SPIE vol. 6154, 2006 (9 total pages).

"Strategies for Beam Homogenizing," SUSS MicroOptics SA, Neuchatel, Switzerland, Technical Information Sheet 10—Beam Homogenizer, available from http://www.amstechnologies.com/fileadmin/amsmedia/downloads/2084_SMO_TechInfo_Sheet_10.pdf, Jan. 2006 (5 total pages).

Rajeev Khare and Paritosh K. Shukla (Nov. 30, 2010). "Temporal Stretching of Laser Pulses, Coherence and Ultrashort Pulse Laser Emission," Dr. F. J. Duarte (Ed.), ISBN: 978-953-307-242-5, InTech, Available from: http://www.intechopen.com/books/coherence-and-ultrashort-pulse-laser-emission/temporal-stretching-of-laserpulses (23 total pages).

Reinhard Voelkel, et al., "Laser Beam Homogenizing: Limitations and Constraints," SPIE Europe Optical Systems Design, Sep. 2-5, 2008, Glasgow, Scotland, United Kingdom (12 total pages).

O. Homburg et al., "Efficient beam shaping for high-power laser applications," Proc. of SPIE vol. 6216, pp. 621608-1-621608-8 (8 total pages), 2006.

Maik Zimmerman et al., "Microlens Laser Beam Homogenizer—From Theory to Application," Proc. of SPIE vol. 6663, pp. 666302-1-666302-13 (13 total pages), 2007.

George N. Lawrence et al., "Characterization of excimer lasers for use with optical integrators," Proc. of SPIE vol. 3930, pp. 95-102 (8 total pages), 2000.

Blaine R. Copenheaver, U.S. International Searching Authority, International Search Report and Written Opinion, counterpart PCT Application No. PCT/US2017/057850, dated Jan. 22, 2018, 15 pages total.

Daniel M. Brown et al., "Multi-Aperture Beam Integration Systems," Laser Beam Shaping, Chapter 7, pp. 273-311, Ed. Deckey, Holswade, 2000.

* cited by examiner

HOMOGENIZATION OF LIGHT BEAM FOR SPECTRAL FEATURE METROLOGY

CROSS-REFERENCE TO RELATED APPLICATION

This application is a continuation of U.S. patent application Ser. No. 15/364,006, filed Nov. 29, 2016, now allowed, and titled HOMOGENIZATION OF LIGHT BEAM FOR SPECTRAL FEATURE METROLOGY, which is incorporated herein by reference in its entirety.

TECHNICAL FIELD

The disclosed subject matter relates to an apparatus for homogenizing a light beam in order to measure and analyze a spectral feature, such as, for example, bandwidth or wavelength, of the light beam.

BACKGROUND

In semiconductor lithography (or photolithography), the fabrication of an integrated circuit (IC) includes performing a variety of physical and chemical processes on a semiconductor (for example, silicon) substrate (which is also referred to as a wafer). A photolithography exposure apparatus or scanner is a machine that applies a desired pattern onto a target portion of the substrate. The wafer is irradiated by a light beam that extends along an axial direction, and the wafer is fixed to a stage so that the wafer generally extends along a plane that is lateral (and orthogonal) to the axial direction. The light beam has a wavelength in the deep ultraviolet (DUV) range, for example, from about 10 nanometers (nm) to about 400 nm.

The light beam is produced by an optical source. An accurate knowledge of spectral features or properties (for example, bandwidth and wavelength) of the light beam can be used, for example, to enable control of a minimum feature size or critical dimension (CD) at the wafer. The CD is related to the feature size that is printed on the wafer.

SUMMARY

In some general aspects, a metrology system is configured to measure a spectral feature of a pulsed light beam, The metrology system includes a beam homogenizer in the path of the pulsed light beam, an optical frequency separation apparatus in the path of the pulsed light beam exiting the beam homogenizer, and at least one sensor. The beam homogenizer includes an array of wavefront modification cells, and each wavefront modification cell includes a surface area that matches a size of at least one of the spatial modes of the light beam. The optical frequency separation apparatus is configured to interact with the pulsed light beam and to output a plurality of spatial components that correspond to the spectral components of the pulsed light beam. The sensor receives and senses the output spatial components.

Implementations can include one or more of the following features. For example, the metrology system can also include a control system connected to an output of the at least one sensor and configured to: measure a property of the output spatial components from the optical frequency separation apparatus for one or more pulses; analyze the measured property to calculate an estimate of the spectral feature of the pulsed light beam; and determine whether the estimated spectral feature of the pulsed light beam is within an acceptable range of values of spectral features. The spectral feature can be a bandwidth of the pulsed light beam. The metrology system can also include a spectral feature selection system optically connected to the pulsed light beam. The control system can be connected to the spectral feature selection system; and if the control system determines that the estimated spectral feature of the pulsed light beam is outside the acceptable range, then the control system can be configured to send an adjustment signal to the spectral feature selection system to modify the spectral feature of the pulsed light beam.

A surface area of a cell can match a mode size of the light beam if the cell surface area is between 0.5 and 1.5 times the area of the spatial mode. A surface area of a cell can match a mode size of the light beam if the cell surface area is between 0.9 and 1.1 times the area of the spatial mode.

The metrology system can also include an optical diffuser in the path of the light beam, wherein the beam homogenizer receives the light beam that is output from the optical diffuser. The optical diffuser can include a microlens array.

The metrology system can include a beam separation device in the path between a source that produces the light beam and a photolithography exposure apparatus. The beam separation device can direct a first percentage of the light beam toward the beam homogenizer, and can direct a second percentage of the light beam along the path toward the photolithography exposure apparatus. The metrology system can also include an optical temporal pulse stretcher between the beam separation device and the beam homogenizer. The optical temporal pulse stretcher can be a passive optical element.

The beam homogenizer can include an array having a plurality of wavefront modification cells. The beam homogenizer can include a lens that receives the light beam output of the array. The beam homogenizer can include at least two arrays, each array having a plurality of wavefront modification cells. The beam homogenizer can include a lens that receives the light beam output of the at least two arrays. The metrology system can include an actuator connected to one or more of the at least two arrays, and configured to adjust a distance between the at least two arrays.

The homogenized beam plane can be at the focal plane of the lens. The metrology system can include a spinning diffuser at the homogenized beam plane.

The lens can have a focal length that is large enough so that the spacing between diffraction spikes of the output light beam from the array or the at least two arrays is greater than an area of the at least one sensor that receives the output light beam from the beam homogenizer. The wavefront modification cell array can be made of calcium fluoride, fused silica, aluminum fluoride, encapsulated magnesium fluoride, gadolinium fluoride, or sodium aluminum fluoride.

The wavefront modification cell array can include an array of lenses or lenslets.

The wavefront modification cell array can be a transmissive cell array.

The optical frequency separation apparatus can include one or more etalons.

The light beam can have a plurality of wavelengths, at least some being in the deep ultraviolet range. The size of the spatial mode of the light beam can correspond to a transverse area across the light beam in which all points within the transverse area have a fixed phase relationship.

The beam homogenizer can be in the path of a pulsed light beam output from a power amplifier of an optical source.

The beam homogenizer can be in the path of a pulsed seed light beam output from a master oscillator of an optical source.

In other general aspects, a metrology system is configured to measure a spectral feature of a pulsed light beam. The metrology system includes: a beam homogenizer in the path of the pulsed light beam, an optical frequency separation apparatus that receives the pulsed light beam exiting the beam homogenizer, and at least one sensor that receives and senses the output spatial components. The beam homogenizer includes a pair of arrays, each array having a plurality of wavefront modification cells; and a lens. The cells of the pair of arrays are spaced and sized so that each spatial mode of the pulsed light beam that passes through the beam homogenizer is projected to the same area at the focal plane of the lens. The optical frequency separation apparatus is configured to interact with the pulsed light beam and to output a plurality of spatial components that correspond to the spectral components of the pulsed light beam.

Implementations can include one or more of the following features. For example, each cell can have a surface area that matches a size of a spatial mode of the light beam. The surface area of a wavefront modification cell can be between 0.5 and 1.5 times the area of the spatial mode. The size of the spatial mode of the light beam can correspond to a transverse area across the light beam in which all points within the transverse area have a fixed phase relationship.

The metrology system can include a control system connected to an output of the at least one sensor, the control system can be configured to: measure a property of the output spatial components for one or more pulses of the light beam; analyze the measured property to calculate an estimate of the spectral feature of the pulsed light beam; and determine whether the estimated spectral feature is within an acceptable range of values of the spectral feature.

The metrology system can include an optical diffuser in the path of the light beam, and the beam homogenizer can receive the light beam that is outputted from the optical diffuser.

The metrology system can include a spinning diffuser at the focal plane of the lens.

The optical frequency separation apparatus can include one or more etalons.

In other general aspects, a deep ultraviolet light source includes: an optical source including at least one gain medium that produces a pulsed light beam; a beam separation device that directs a first portion of the pulsed light beam along a metrology path and directs a second portion of the pulsed light beam along a lithography path, a metrology system in the metrology path, and a beam delivery system in the lithography path that receives the pulsed light beam from the optical source and directs the pulsed light beam to a photolithography exposure apparatus. The metrology system includes: a beam homogenizer in the path of the pulsed light beam, the beam homogenizer having at least a pair of arrays, each array having a plurality of wavefront modification cells; a lens, wherein the cells of the pair of arrays are spaced and sized so that each spatial mode of the pulsed light beam that passes through the beam homogenizer is projected to the same area at the focal plane of the lens; an optical frequency separation apparatus that receives the pulsed light beam exiting the beam homogenizer, and is configured to interact with the pulsed light beam and to output a plurality of spatial components that correspond to the spectral components of the pulsed light beam; and at least one sensor that receives and senses the output spatial components.

Implementations can include one or more of the following features. For example, the light source can include an optical temporal pulse stretcher between the beam separation device and the beam homogenizer.

The optical source can include: a first gain medium that is a part of a master oscillator that produces a pulsed seed light beam; and a second gain medium that is a part of a power amplifier that receives the pulsed seed light beam from the master oscillator and outputs the pulsed light beam. A beam homogenizer can be in a path of the pulsed seed light beam or a beam homogenizer can be in a path of the pulsed light beam output from the power amplifier. A first beam homogenizer can be in the path of the pulsed seed light beam and a second beam homogenizer can be in the path of the pulsed light beam output from the power amplifier.

In other general aspects, a method for measuring a spectral feature of a light beam includes homogenizing the light beam including projecting each transverse spatial mode of the light beam to the same transverse area at a beam homogenization plane; interacting the homogenized light beam with an optical frequency separation apparatus that outputs spatial components that correspond to the spectral components of the light beam; sensing the spatial components; measuring a property of the sensed spatial components; analyzing the measured properties to estimate a spectral feature of the pulsed light beam; and determining whether the estimated spectral feature of the pulsed light beam is within an acceptable range of spectral features.

Implementations can include one or more of the following features. For example, if it is determined that the estimated spectral feature of the pulsed light beam is outside the acceptable range, an adjustment signal can be sent to a spectral feature selection system to modify the spectral feature of the pulsed light beam.

DESCRIPTION

Figure 1:
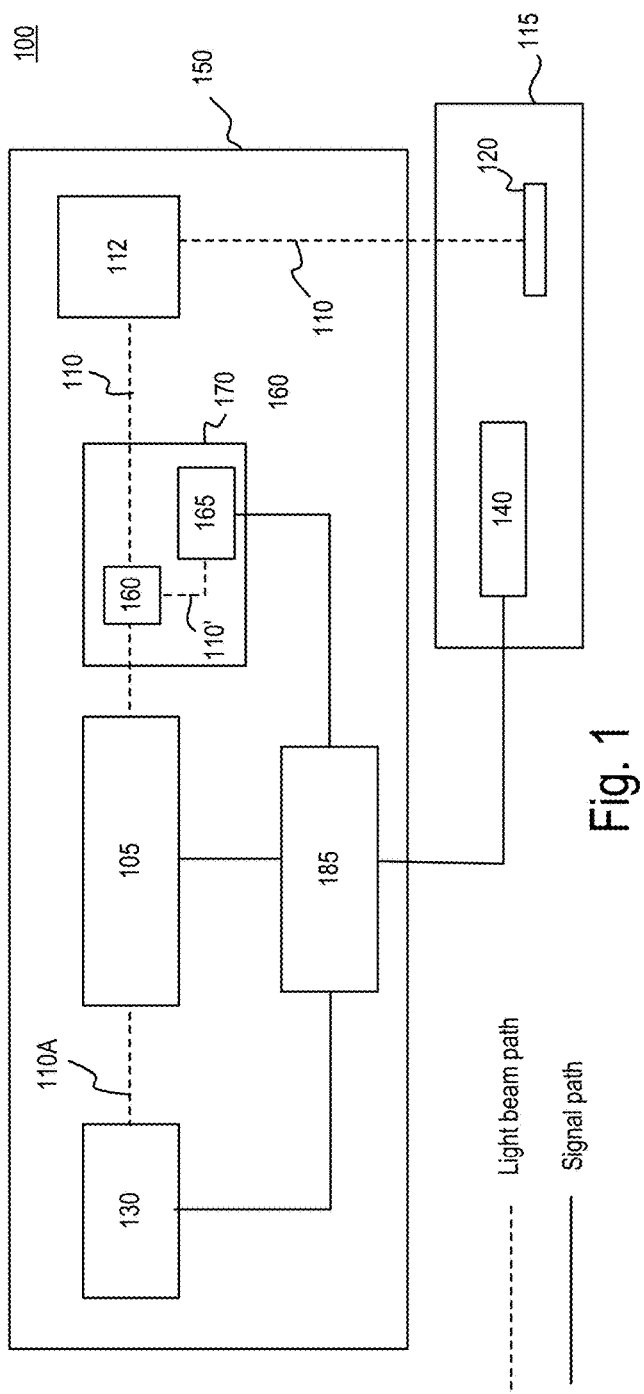
FIG. 1 is a block diagram of a photolithography system producing a pulsed light beam that is directed to a photolithography exposure apparatus.

Referring to FIG. 1, a photolithography system 100 includes an optical source 105 that produces a pulsed light beam 110 that is directed to a lithography exposure apparatus 115 for patterning microelectronic features on a wafer 120. The photolithography system 100 uses a light beam 110 having a wavelength in the deep ultraviolet (DUV) range, for example, with wavelengths of between about 10 nanometers (nm) and about 400 nm. The wavelength can be, for example, 248 nm or 193 nm. The size of the microelectronic features patterned on the wafer 120 depends on the wavelength of the light beam 110, with a lower wavelength resulting in a smaller minimum size of the microelectronic feature. When the wavelength of the light beam 110 is 248 nm or 193 nm, the minimum size of the microelectronic features can be, for example, 50 nm or less. The focus location of the pulsed light beam 110 at the wafer 120 correlates with the wavelength of the light beam 110. Moreover, the bandwidth of the light beam 110 can impact the critical dimension (CD) of these features.

Figure 2:
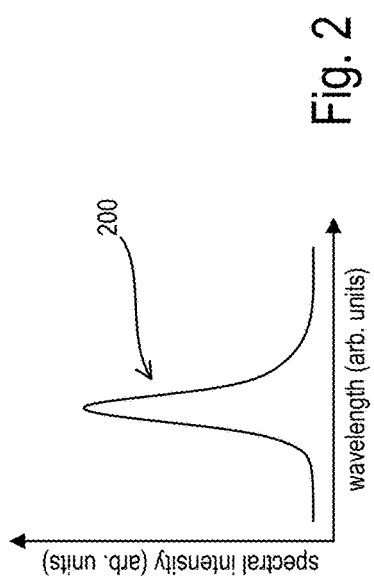
FIG. 2 is a graph of an exemplary optical spectrum of the pulsed light beam produced by the photolithography system of FIG. 1.

The bandwidth that is measured or determined and used for analysis and control of the pulsed light beam 110 can be the actual, instantaneous bandwidth of its optical spectrum 200, as shown in FIG. 2. The optical spectrum 200 contains information about how the optical energy or power of the light beam 110 is distributed over different wavelengths (or frequencies). The optical spectrum 200 of the light beam 110 is depicted in the form of a diagram where the spectral intensity (not necessarily with an absolute calibration) is plotted as a function of the wavelength or optical frequency. The optical spectrum 200 can be referred to as the spectral shape or spectrum of the light beam 110. Spectral properties or features of the light beam 110 include any aspect or representation of the optical spectrum. For example, bandwidth is a spectral feature. The bandwidth of the light beam is a measure of the width of the spectral shape, and this width can be given in terms of wavelength or frequency of the laser light. Any suitable mathematical construction (that is, metric) related to the details of the optical spectrum 200 can be used to estimate a value that characterizes the bandwidth of the light beam. For example, the full width of the spectrum at a fraction (X) of the maximum peak intensity of the spectral shape (referred to as FWXM) can be used to characterize the light beam bandwidth. As one example, in a commonly used spectral-shape characterization, the fraction X is 50% and the respective metric is commonly referred to as the full width at half maximum (FWHM). As another example, the width of the spectrum that contains a fraction (Y) of the integrated spectral intensity (referred to as EY) can be used to characterize the light beam bandwidth. In one example in common use for characterizing the spectral properties of the light beam 110, the fraction Y is 95%.

Various disturbances (such as, for example, density or pressure of the gain medium or media in the optical source 105, temperature gradients of optical components, pressure gradients, optical distortions) act on the optical source 105 and the light beam 110 to modify the spectral properties or features of the light beam 110. For example, chromatic aberration caused by optical components that interact with the light beam 110 can cause an increase in the bandwidth of the light beam 110. Thus, the photolithography system 100 includes other components, such as, for example, a spectral feature selection system 130, at least one measurement (or metrology) system 170, and a control system 185, that are used to determine the impact of the disturbances on the light beam 110 and to correct for the effect of such disturbances on the light beam 110.

Because of the disturbances, the actual spectral feature (such as the bandwidth or the wavelength) of the light beam 110 at the wafer 120 may not correspond to or match with the desired spectral feature. Thus, the actual spectral feature (such as a bandwidth) of light beam 110 is measured or estimated during operation by estimating a value of a metric from the optical spectrum 200 so that an operator or an automated system (for example, a feedback controller) can use the measured or estimated bandwidth of the light beam 110 to adjust the properties of the optical source 105 and to adjust the optical spectrum of the light beam 110.

Figure 3:
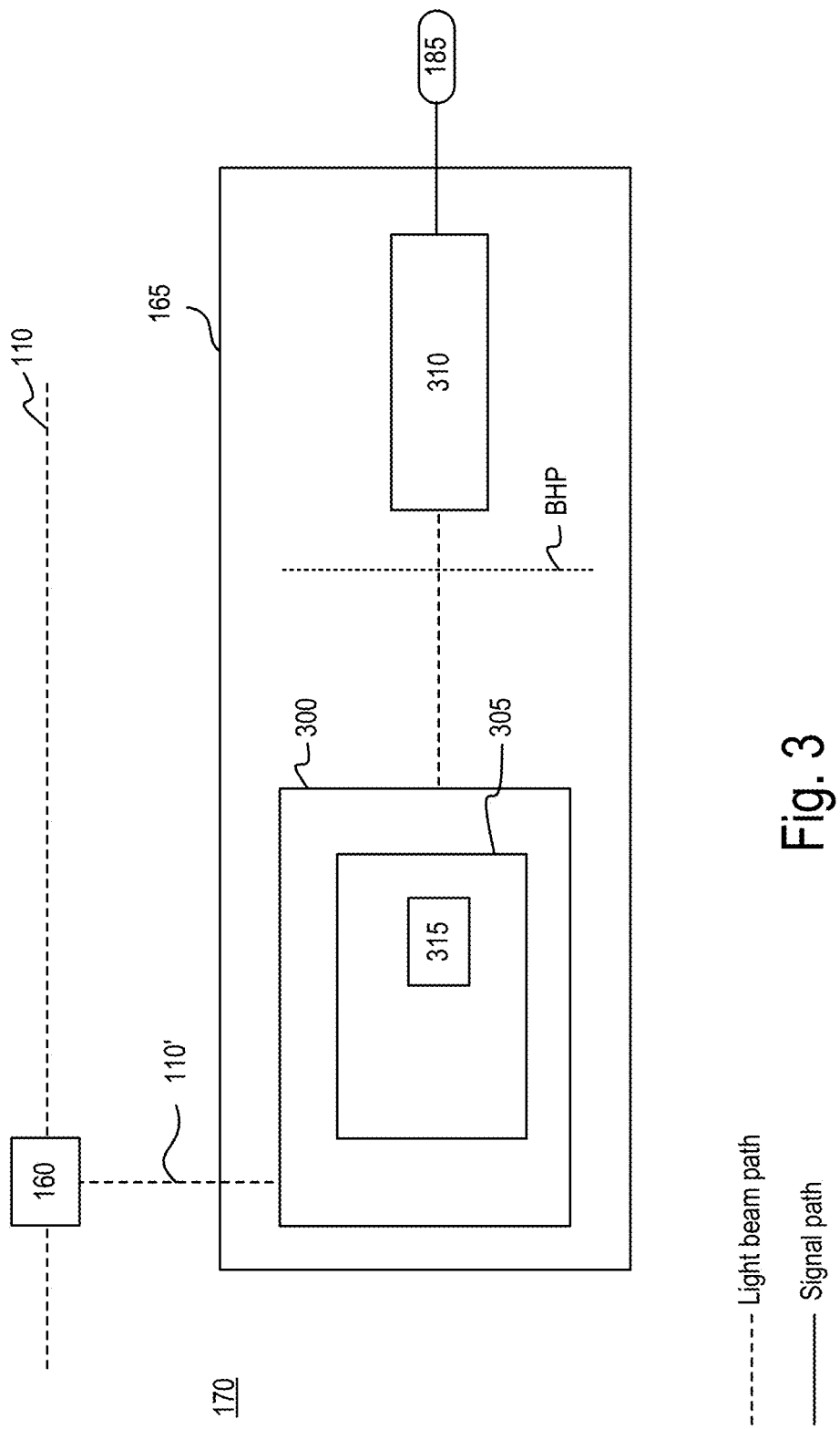
FIG. 3 is a block diagram of an exemplary metrology system that measures one or more spectral features of the pulsed light beam produced by the photolithography system of FIG. 1.

Referring to FIG. 3, to this end, the metrology system 170 includes a beam separator 160 and a diagnostic apparatus 165. The diagnostic apparatus 165 receives a light beam 110' that is separated from the light beam 110 by the beam separator 160. The beam separator 160 is placed in a path between the optical source 105 and the photolithography exposure apparatus 115. The beam separator 160 directs the light beam 110' (which is a first portion or percentage of the light beam 110) into the diagnostic apparatus 165 and directs a second portion or percentage of the light beam 110 toward the exposure apparatus 115. In some implementations, the majority of the light beam 110 is directed in the second portion toward the exposure apparatus 115. For example, the beam separator 160 directs a fraction (for example, 1-2%) of the light beam 110 into the diagnostic apparatus 165 and thus the light beam 110' has about 1-2% of the power of the light beam 110. The beam separator 160 can be, for example, a beam splitter.

The diagnostic apparatus 165 includes a spectral detection system 310 that measures the spectral feature or features (such as the bandwidth and/or the wavelength) of the light beam 110 based on information about the optical spectrum 200 of the light beam 110'. As discussed herein, the spectral detection system 310 include a spectrometer (such as an etalon spectrometer) that interacts with the light beam 110' and outputs spatial components that correspond to the spectral components of the light beam 110', and a sensor that estimates the spectral feature or features based on the outputted spatial components.

In order to uniformly sample the spectral content of the light beam 110' at the sensor, to evenly distribute the intensity of the light beam 110' at the sensor, and to provide a more accurate measurement of the spectral feature from the sensor, the diagnostic apparatus 165 includes a beam homogenizer 305 that is a part of a beam preparation system 300. The beam homogenizer 305 includes a coherence-area matching apparatus 315 that is configured to reduce speckle noise and to improve beam homogenization of the light beam 110' impinging upon the sensor of the spectral detection system 310. The coherence-area matching apparatus 315 mixes different spatial components of the light beam 110' and smoothes out the intensity profile of the light beam 110' prior to the light beam 110' entering the etalon spectrometer. Moreover, the coherence-area matching apparatus 315 modifies the light beam 110' so that its spatial modes (which are its transverse electromagnetic modes) are overlapping at a beam homogenization plane (BHP) prior to entering the spectral detection system 310. The coherence-area matching apparatus 315 reduces the spatial coherence of the light beam 110' before the light beam 110' enters the spectral detection system 310.

Figure 4A:
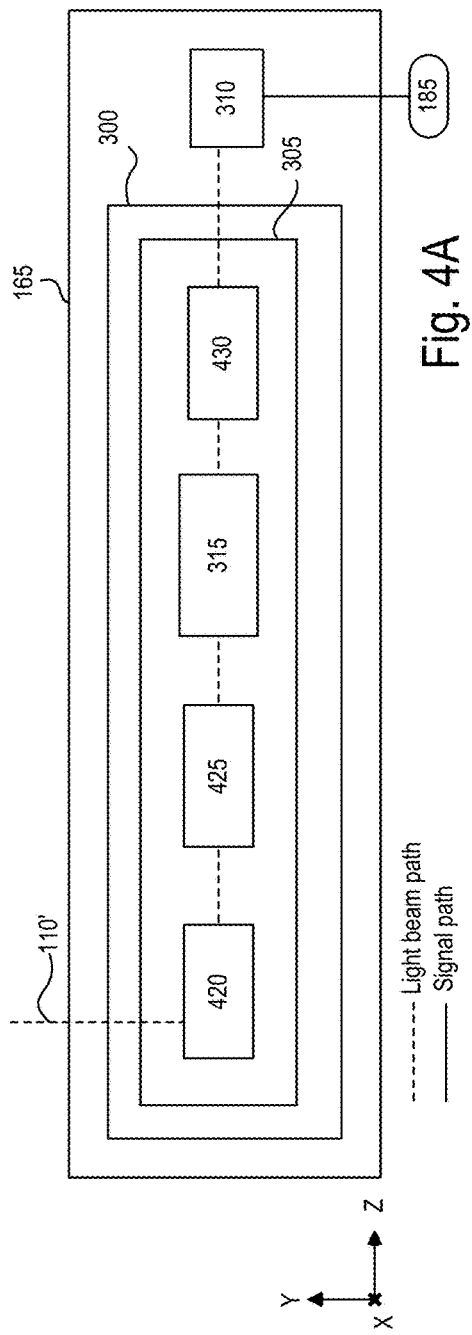
FIG. 4A is a block diagram of an exemplary diagnostic apparatus of the metrology system of FIG. 3.
Figure 4B:
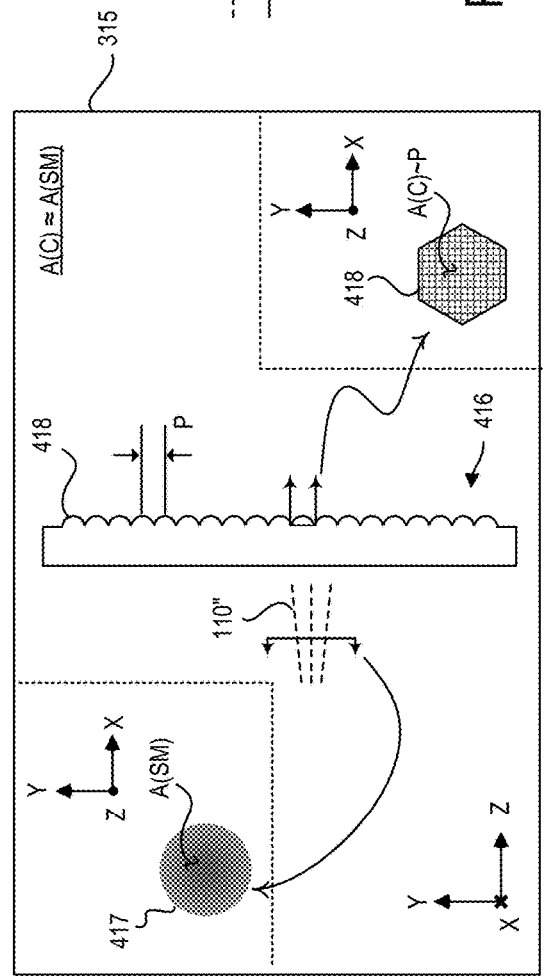
FIG. 4B is a block diagram of an exemplary coherence-area matching apparatus of the diagnostic apparatus of FIG. 4A.

As shown in FIGS. 4A and 4B, the coherence-area matching apparatus 315 includes at least one array 416 of wavefront-modification cells 418. The array 416 is arranged to be perpendicular to the direction of the beam path; in this example, the beam path is designated as the Z direction. Each cell 418 is an optical element that modifies the wavefront of the light beam 110'. For example, each cell 418 can be a refractive optical element such as a lens having a convex surface, and thus, the array 416 can be a microlens array.

In some implementations, the microlenses 418 of the array 416 are arranged in a periodic two-dimensional grid to form the array, with the distances between the adjacent centers of microlenses 418 (taken along the X-Y plane perpendicular to the Z direction) being separated by a standard distance, which is referred to as a pitch, P.

Moreover, each cell 418 has an area (A(C)) taken along the X-Y plane. The area A(C) of a cell 418 is mathematically related to the pitch P of the array 416, the pitch P of the array 416 being the shortest distance between the centers of adjacent cells in the X-Y plane. The area A(C) of each cell 418 is matched to a size (for example, an area A(SM)) of one or more of the transverse spatial modes 417 of the light beam 110'. The size or area A(SM) of the transverse spatial mode 417 is an area taken along the plane (the X-Y plane) that is perpendicular to the beam path (the Z direction).

In some implementations, it is possible to use a random or pseudo-random distribution of areas A(C) for the cells 418 of the array 416. For example, the area A(C) of each cell 418 could be matched to the coherence properties of the light beam 110' and thus the area of a particular cell 418 in the array 416 could be distinct from the area of other cells 418 of the array 416.

The transverse spatial modes are electromagnetic field distributions that reproduce themselves after one round trip within the resonator or resonators of the optical source 105. Because of the geometry and configuration of the resonators within the optical source 105, the transverse spatial modes can have complicated intensity distributions and may not be well defined. Each transverse spatial mode has a distinct wavelength and the light beam 110' can have on the order of 1000-2000 transverse spatial modes, depending on the geometry and configuration of the optical source 105. For example, an estimated size or area of a transverse spatial mode of the light beam 110' is 0.7 mm×0.1 mm in the orthogonal transverse directions at the output of the beam separator 160. If the overall transverse size of the light beam 110' is 12.5 mm×12.5 mm, then there would be about 1800 coherence cells in the light beam 110' at the output of the beam separator 160. The exemplary transverse spatial mode 417 of the light beam 110' that is shown in FIG. 4B is a view taken along the Z direction, and is purely a schematic representation of a rather simple transverse mode that is shown for illustration purposes only and may not be an actual intensity distribution produced in any of the modes of the light beam 110'. Additionally, the array 416 and cells 418 are not drawn to scale.

The area A(C) of the cell can be considered to "match" the transverse spatial mode size A(SM) if the cell area A(C) is within 0.5 to 1.5 times (for example, within 0.9 to 1.1 times) the spatial mode size A(SM). By matching the cell area A(C) to the spatial mode size A(SM), it becomes possible to project all of the spatial modes of the light beam 110' to the same area at a beam homogenization plane downstream of the coherence-area matching apparatus 315. A closer match (for example, within 0.9 to 1.1 times) between the cell area A(C) and the transverse spatial mode size A(SM) can be beneficial in some situations, for example, situations in which the transverse spatial modes are more clearly defined and/or not overlapping with each other.

The spatial mode size A(SM) can be determined by estimating a spatial coherence area or size of the light beam 110' because within a single spatial mode 417, there is coherence, and thus, all points within the area of the spatial mode 417 have a fixed phase relationship with each other. The spatial coherence area can be determined by measuring interference fringes between two pinholes separated by varying distance and placed in the path of the light beam 110'.

As also shown in FIG. 4A, the beam homogenizer 305 can include other elements or components for modifying aspects of the light beam 110'. For example, the beam homogenizer can also include a pulse stretcher system 420, a diffuser system 425, and a spatial adjustment system 430.

The pulse stretcher system 420 includes a pulse stretcher that optically acts on the light beam 110' to increase the duration of each of the pulses in the light beam 110" without introducing significant losses so that the peak power of the light beam 110' is reduced without reducing its average power. The pulse stretcher system 420 acts on the light beam 110' prior to the light beam 110' entering the coherence-area matching apparatus 315 to further reduce the optical speckle noise that can be found at the homogenized beam plane. The pulse stretcher system 420 is an optical and passive configuration of optical elements that split the amplitude of the pulse of the light beam 110' into split portions, introduce optical delays among these split portions, and then recombine these temporally-delayed portions of the pulse to provide a temporally stretched pulse of the light beam 110' at the output. In this way, different temporal portions of the pulse that are not coherent are combined, and the speckle noise of the light beam 110' is further reduced and therefore the spatial uniformity of the light beam 110' is improved. As discussed in greater detail below, the pulse stretcher system 420 can therefore include optical components such as beam splitters and reflective optics. The reflective optics can be flat mirrors or curved (for example, concave or convex) mirrors that could be confocal. The delay introduced in the split portion of the pulse produced by the pulse stretcher system 420 is equal to or longer than the fast temporal component of the light beam 110'. For example, a pulse duration of the light beam 110' from the optical source can be about 40 ns. Moreover, in some implementations, test data indicates that, at any given moment, the pulse is temporally coherent with other moments in the pulse that fall within 2.5 ns of that given moment, but the pulse has significantly reduced coherence with moments in the pulse that are delayed by more than 2.5 ns. Thus, the coherence time (which is the delay over which the phase or amplitude of the pulse wanders by a significant amount) is about 2.5 ns in this example. In this example, the delay introduced in the split portion can be about 2.5 ns and the total path length that the split portion takes through the pulse stretcher system 420 on one pass can be on the order of tens of centimeters (cm) or about 70-80 cm. An example of a pulse stretcher system 420 is discussed below with reference to FIG. 5.

The diffuser system 425 includes one or more optical elements that are configured to evenly diffuse the light beam 110' prior to the light beam 110' entering the coherence-area matching apparatus 315. The diffuser system 425 causes the light beam 110' to spread evenly across the coherence-area matching apparatus 315, thus minimizing or removing high intensity bright spots. The diffuser system 425 alters the angular divergence of the light beam 110' in a manner that ensures that the angular divergence of the light beam 110' output from the diffuser system 425 is less than an acceptance angle of the array 416 within the coherence-area matching apparatus 315. For example, the diffuser system 425 can modify the angular divergence of the light beam 110' so that the angular divergence is much smaller than (for example, 20-40% less than) the acceptance angle of the array 416. The diffuser system 425 smoothes out or otherwise mitigates diffraction spikes that can sometimes be produced by the coherence-area matching apparatus 315. The diffuser system 425 creates multiple laterally (that is, spatially along a direction perpendicular to the direction of the light beam 110') shifted copies of the diffraction spikes, which then smoothes out the intensity profile of the light beam 110' at the image plane (in the spectral detection system 310). The diffuser system 425 can be a microlens array or a diffractive optic (which can be transmissive or reflective). The diffuser system 425 can be a stationary or fixed microlens array or a diffractive optic. An example of a diffuser system 425 is discussed below with reference to FIG. 5.

The spatial adjustment system 430 is placed at the output of the coherence-area matching apparatus 315 and it works to refract the light beam 110' to spread out the spacing between diffraction spikes caused due to the periodic nature of the coherence-area matching apparatus 315. In this way, the spacing between the diffraction spikes can be increased by the spatial adjustment system 430 so that the spacing is larger than a region of interest of the sensor within the spectral detection system 310. The spatial adjustment system 430 can be a lens that is positioned so that its focal plane overlaps the beam homogenization plane of the coherence-area matching apparatus 315. An example of a spatial adjustment system 430 is discussed below with reference to FIG. 5.

Figure 5:
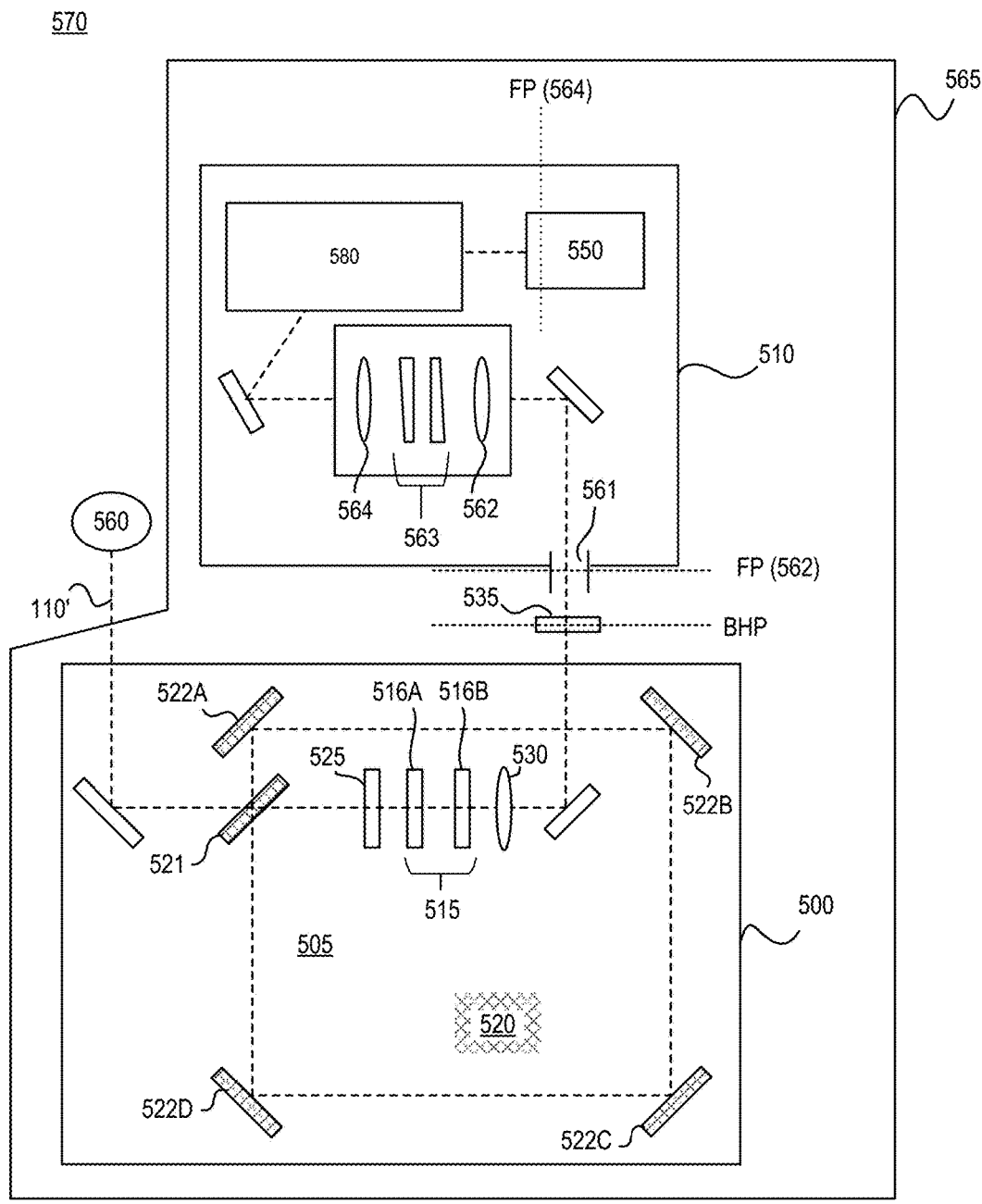
FIG. 5 is a block diagram of an exemplary diagnostic apparatus of the metrology system of FIG. 3, which uses a coherence-area matching apparatus such as shown in FIG. 4B.

Referring to FIG. 5, an exemplary metrology system 570 is shown. In the metrology system 570 of FIG. 5, the diagnostic apparatus 565 receives the light beam 110' that has been separated from the primary light beam 110 by the beam separator 560. The diagnostic apparatus 565 includes a beam preparation system 500 having a beam homogenizer 505 that includes a pulse stretcher system 520, a diffuser system 525, a coherence-area matching apparatus 515, and a spatial adjustment system 530. All of the optical components within the metrology system 570 are made of materials and coatings that are configured to operate in a range of wavelengths that corresponds to the wavelength of the light beam 110', for example, in the DUV wavelength range.

The pulse stretcher system 520 includes a beam splitter 521 that splits the amplitude of the pulse of the light beam 110' into amplitude portions, and circulates the split portions around a ring using a set of mirrors 522A, 522B, 522C, 522D. After circulating around the ring, the temporally-delayed portion of the split portion exits the pulse stretcher system 520 and is recombined with split portions that are transmitted through the beam splitter 521. The mirrors 522A, 522B, 522C, 522D can be flat or curved.

The diffuser system 525 is a microlens array that is placed at the output of the pulse stretcher system 520 and before the coherence-area matching apparatus 515. As previously discussed, the diffuser system 525 diffuses the light beam 110' and also alters the angular divergence of the light beam 110' in a manner that ensures that the angular divergence of the light beam 110' is less than an acceptance angle of the array within the coherence-area matching apparatus 515.

Figure 6:
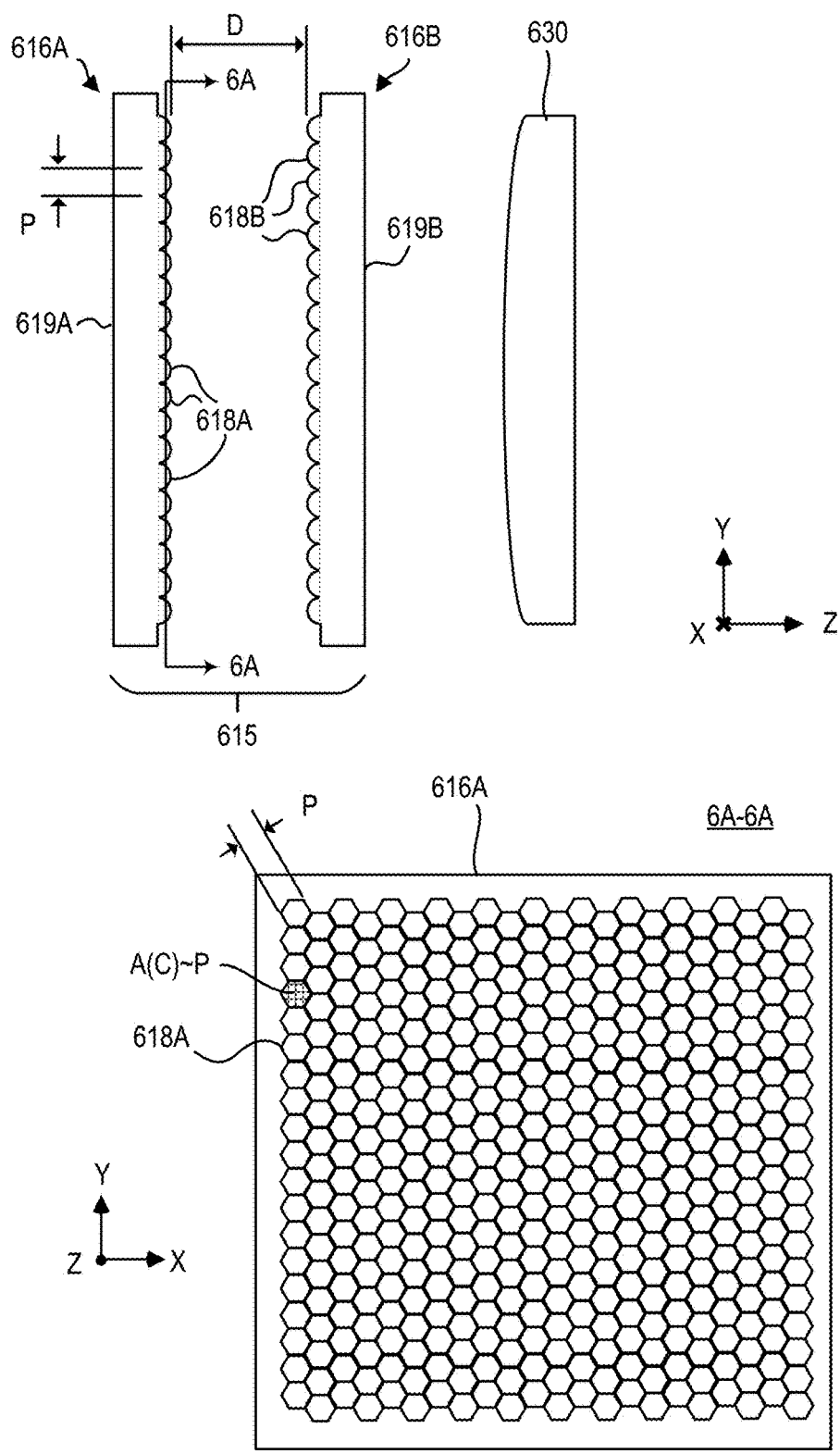
FIG. 6 is a schematic side cross sectional view and a transverse plan view of an exemplary wavefront modification device that is used in the coherence-area matching apparatus of any of FIG. 4A, 4B, or 5.

In some implementations, the coherence-area matching apparatus 515 includes a pair of wavefront modification devices 516A, 516B. Each device 516A and 516B includes a two-dimensional array of wavefront modification cells (such as shown in FIG. 4). For example, as shown in FIG. 6, the coherence-area matching apparatus 615 includes, as the wavefront modification devices 516A and 516B, microlens arrays 616A and 616B. Each array 616A, 616B includes, as the wavefront modification cells, respective sets of microlenses 618A, 618B, each microlens 618A, 618B refracting the light of the light beam 110'. In FIG. 6, only three microlenses 618A, 618B are referred to and there can be more or fewer microlenses in the array. The microlenses 618A of the array 616A are arranged in a periodic two dimensional grid to form the array, with the distances between the adjacent centers of microlenses 618A being separated by a standard distance, which is referred to as a pitch, P.

As discussed previously, the arrays 616A and 616B are arranged to be perpendicular to the direction of the beam path; in this example, the beam path is designated as the Z direction and thus the array extends along the X-Y plane. Moreover, the microlenses 618A of the array 616A are aligned with the microlenses 618B of the array 616B along the X-Y plane. Each microlens is a small lens, having a diameter or length that is less than a millimeter (mm) and often as small as 10 micrometers (µm). A single microlens is a single element with one plane surface and one spherical convex surface to refract the light. The microlenses of the array 616A and 616B are applied to a support such as respective substrate 619A and 619B. The microlenses 618A, 618B and the substrates 619A, 619B are made of a material that is transmissive to the wavelength range of the light beam 110'. In some implementations, the microlenses 618A, 618B and the respective substrates 619A, 619B are made of calcium fluoride.

In other implementations, the coherence-area matching apparatus 315 includes a single wavefront modification device (such as the device 516A), and the single wavefront modification device 316 functions with other aspects of the diagnostic apparatus 165 to homogenize the beam 110' in order to uniformly sample the spectral content of the light beam 110' at the sensor, to evenly distribute the intensity of the light beam 110' at the sensor, and to provide a more accurate measurement of the spectral feature from the sensor. In such implementations, the coherence-area matching apparatus 315 would still be configured to reduce speckle noise and to improve beam homogenization of the light beam 110' impinging upon the sensor of the spectral detection system 310. Even using a single wavefront modification device 516A, the coherence-area matching apparatus 315 is able to mix the spectral content of the light beam 110' and smooth out the intensity profile of the light beam 110' prior to the light beam 110' entering the etalon spectrometer. Additionally, the coherence-area matching apparatus 315 that uses a single wavefront modification device 516A can modify the light beam 110' so that its spatial modes (which are its transverse electromagnetic modes) are overlapping at a beam homogenization plane (BHP) prior to entering the spectral detection system 310.

In this example, the microlenses 618A, 618B have a hexagonal shape (along the X-Y plane) and they are arranged for a high fill factor, which means that there is very little substrate exposed between each microlens 618A, 618B. The fill factor is measured in terms of the percentage of area covered by microlenses 618A, 618B to the area of exposed substrate 619A, 619B between the microlenses 618A, 618B and the fill factor can be at least 90%. The microlenses 618A, 618B can be plano-convex shapes, in which the planar side faces the respective substrate 619A, 619B. The dimensions of the array 616A, 616B are determined by the transverse size of the light beam 110' and the size of the transverse spatial modes of the light beam 110'.

Moreover, as discussed above, an area A(C) of each microlens 618A, 618B is matched to a size A(SM) of each spatial mode 417 of the light beam 110'. The area A(C) of the microlenses 618A, 618B is directly related to the pitch, P. The spatial modes 417 of the light beam 110' are formed by the design and boundary conditions within the resonator or resonators of the optical source 105. A spatial mode of the light beam 110' is a particular electromagnetic field pattern of radiation measured in a plane perpendicular (that is, transverse) to the propagation direction of the light beam 110'. A spatial mode (which is a transverse mode) manifests itself as the spatial intensity distribution and each spatial mode is associated with a distinct wavelength. Each spatial mode defines a spatially correlated field pattern, and can be considered as a coherence cell. Coherence in this context refers to the spatial coherence, which describes the correlation (or predictable relationship) between waves at different points in space, either laterally (perpendicular to the direction of the light beam 110') or longitudinally (parallel with the direction of the light beam 110'). Thus, spatial coherence describes the ability for two points in space in the extent of the wave (of the light beam 110') to interfere, when averaged over time. The spatial coherence can be considered to be a measure of phase relationships in the wavefront transverse to the direction of propagation of the light beam 110'. The area of a coherence cell is a region of the wavefront within which all points have fixed phase relationships.

In some implementations, the pitch P is a value of about 0.1 to about 0.2 mm to closely match a spatial mode length of about 0.15 mm. In one example, the array 616A, 616B has a dimension of about 10.8 mm×10.8 mm taken along the X-Y plane and the array 616A, 616B can be arranged with a grid of about 80-90 microlenses 618A, 618B along each of the X and Y directions. A pitch P of 0.15 mm for a hexagonal microlens 618A generally corresponds to an area A(C) of about 0.017 mm². The estimated size of the transverse spatial mode for the light beam 110' at the plane of the microlens array 616A is about 0.3 mm×0.1 mm. In this example, the size of the transverse spatial mode corresponds to an area of about 0.016 mm². As discussed above, the size of the transverse spatial mode of the light beam 110' at the output of the beam separator 160 is about 0.7 mm×0.1 mm in the orthogonal transverse directions, but this size of the transverse spatial mode of the light beam 110' can be reduced by a factor of about 2.3 along one of the orthogonal transverse direction by being interacted with a wavefront modification optic before illuminating the microlens array 616A.

Moreover, it is possible for there to be a different number of microlenses 618A, 618B in the grid along the X direction as there are along the Y direction or that the shape of the microlenses 618A, 618B has a varying pitch, P.

Moreover, a spacing or distance D between the arrays 616A and 616B can be adjustable with an actuator that is physically connected to more one or more of the arrays 616A and 616B. In the example shown, the distance D is along the Z direction. The actuator can be connected to the control system 185.

Figure 7:
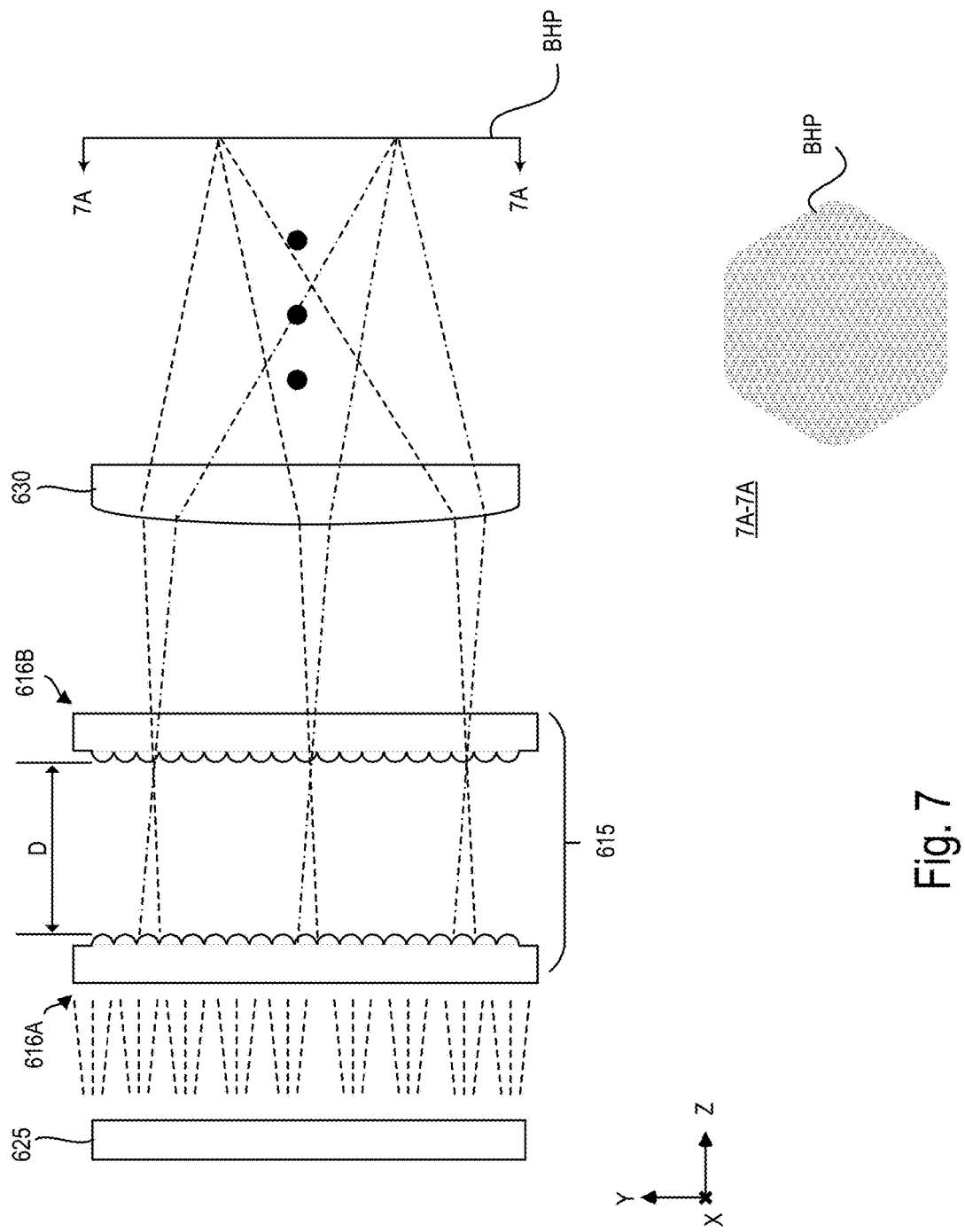
FIG. 7 is a schematic optical diagram showing an exemplary diagnostic apparatus of the metrology system of any of FIG. 3, 4A, 4B, or 5, as well as a location of a beam homogenization plane.

Referring again to FIG. 5, the spatial adjustment system 530 is a lens that is positioned so that its focal plane overlaps the beam homogenization plane BHP of the coherence-area matching apparatus 615. In this example, a moving (for example, spinning) diffuser 535 is placed at the beam homogenization plane BHP. The spinning diffuser 535 is discussed below. Referring also to FIG. 7, the focal length of each microlens 618A, 618B and the aperture size of each microlens 618A, 618B determine a divergence of the light beam 110' that is sampled by each microlens 618A, 618B. This divergence, along with a focal length of the lens 630 determine a size or area (taken along the transverse direction to the direction of the light beam 110') of the light beam 110' at the beam homogenization plane BHP if the array 616B is located at the focal plane of the array 616A (and thus, the distance D is equivalent to the focal length of the array 616A). If the distance D between the array 616A and the array 616B is varied, then the size of the light beam 110' in the transverse direction at the beam homogenization plane BHP is varied. By varying the transverse size of the light beam 110' at the beam homogenization plane BHP, it is possible to change (for example, attenuate) a fluence level on the sensor 550 within the spectral detection system 510 (FIG. 5). The array 616B functions to increase the field of view or acceptance angle of the coherence-area matching apparatus 515.

In this example, the curved or convex surfaces of the microlenses 618A, 618B can be facing each other (as shown in FIG. 6). In particular, if the microlens 618A, 618B are plano-convex lenses, then the microlens arrays 616A, 616B can be oriented such that the convex surfaces of the microlenses 618A of the array 616A are closest to the convex surfaces of the microlenses 618B of the array 616B. Such a design can be useful if the focal length of each microlens is relatively short in comparison to a thickness T of the respective substrate 619A, 619B. In one example, the thickness T of the substrate 619A or 619B is about 2-3 mm, whereas the focal length of a microlens 618A or 618B is about 6 mm. By arranging the curved surfaces of the microlenses 618A, 618B facing each other, it is possible to ensure that the focal plane of the array 616A remains external to the substrate 619B of the other array 616B. Such a configuration can provide a larger range of fluence attenuation at the sensor 550 of the spectral detection system 510 because the two microlens surfaces of the arrays 616A, 616B can be as close as touching.

In an example in which the focal length of each microlens is on the order of the thickness T, then it is possible to orient the arrays 616A, 616B so that the convex surfaces of the microlenses 618A, 618B are not facing each other. This orientation can be useful in a situation in which the focal length of the microlens 616A is much greater than the thickness T of the substrate 619A. Moreover, in a situation in which the focal length of the microlens 616A is on the order of the thickness T of the substrate 619A, then the two microlens arrays 616A, 616B could be made from a single substrate, as discussed with respect to FIG. 13.

As shown in FIG. 7, the microlenses 618A, 618B of the pair of arrays 616A, 616B are spaced (by a value of D) and sized along the X-Y plane so that each spatial mode of the pulsed light beam 110' that passes through the coherence-area matching apparatus 615 is projected to the same area at the focal plane of the lens 530, the focal plane overlapping the beam homogenization plane BHP. The shape of the light beam 110', which is homogenized, at the beam homogenization plane BHP is the same as the shape of the microlenses 618A, 618B and thus would be a hexagonal shape. The sides of the hexagonal shape at the beam homogenization plane BHP have a length of about 2-4 mm if the array 616B is located at the focal plane of the array 616A (in which case, D would equal the focal length of the array 616A).

Referring again to FIG. 5, the spinning diffuser 535 is placed at the beam homogenization plane BHP, which is the plane at which the light beam 110' has been homogenized. The spinning diffuser 535 is a diffuser that is rotated about the direction of the path of the light beam 110'. The diffuser 535 diffuses the light beam 110' to a cone to fill an aperture 561 of the spectral detection system 510. The spinning diffuser 535 also reduces any spikes in the intensity within the light beam 110' that can result from interference of the copies of the spatial modes sampled within the coherence-area matching apparatus 515. Moreover, the aperture 561 is placed at a focal plane FP (562) of an input lens 562 within the spectral detection system 510. By locating the aperture 561 of the spectral detection system 510 at the focal plane FP (562) of the input lens 562, each point from the focal plane FP (562) acts as a point source and accordingly, the input lens 562 acts to collimate the light beam 110' before entering an etalon 563. An output lens 564 is positioned at the exit of the etalon 563 so that its focal plane FP (564) overlaps the active area of the sensor 550.

In some implementations, the etalon 563 includes a pair of partially reflective glass or optical flats 563A, 563B, which can be spaced a short distance (for example, millimeters to centimeters) apart, with the reflective surfaces facing each other. In other implementations, the etalon 563 includes a single plate with two parallel reflecting surfaces. The flats 563A, 563B can be made in a wedge shape to prevent the rear surfaces from producing interference fringes; the rear surfaces often also have an anti-reflective coating. As the light beam 110' passes through the paired flats 563A, 563B, it is multiply reflected, and produces a plurality of transmitted rays, which are collected by the output lens 564 and brought to the active region of the sensor 550. Interference effects, dependent on the direction of the transmitted rays, produce constructive and destructive interference of the different spectral components of the light beam 110', such that only select spectral components are transmitted along the direction of a given ray. In this manner, the spectral content of the light beam 110' is mapped into the spatial direction of the transmitted rays. The spectral detection system 510 also includes an optical delay 580, as needed, to ensure that the sensor 550 is at the focal plane of the output lens 564.

Figure 8:
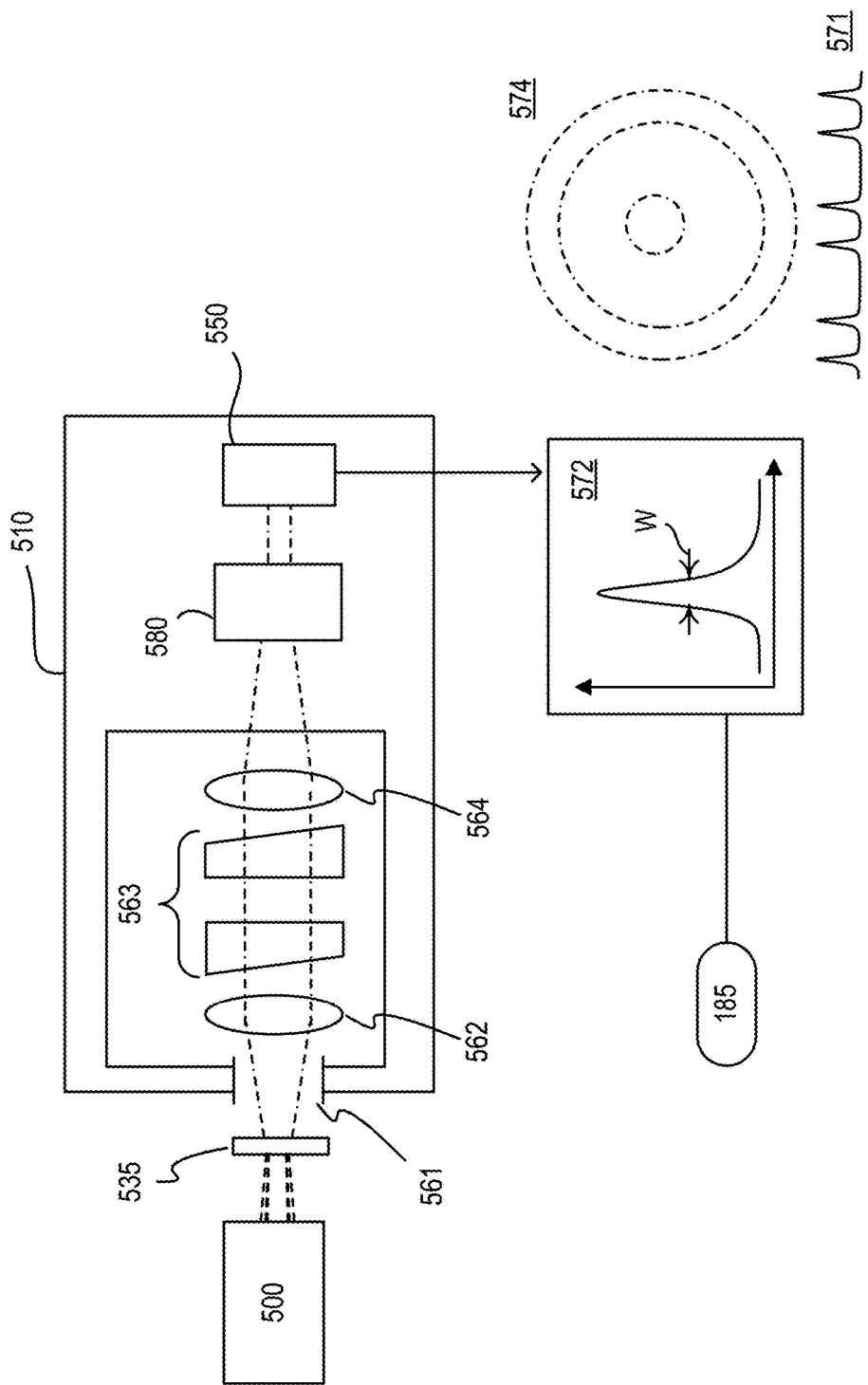
FIG. 8 is a block diagram of an exemplary spectral detection system that can be used in the metrology system of FIG. 5.

Referring also to FIG. 8, more details of the spectral detection system 510 are provided. The etalon 563 interacts with the light beam 110' and outputs a plurality of spatial components 574 that correspond to the spectral components of the light beam 110'. The spectral components of the light beam 110' are in the optical spectrum 572 of the light beam 110'; therefore, they correspond to how the optical energy or power of the light beam 110' is distributed over the different wavelengths. The spatial components 574 correspond to these intensities mapped into a two-dimensional space. Thus, the etalon 563 transforms the spectral information (such as the wavelength) of the light beam 110' into spatial information that can be sensed or detected by the sensor 550. The transformation maps the spectral information (such as the wavelength) to different positions in space so that the spectral information that can be observed by the sensor 550.

The etalon 563 produces as the spatial components 574 an interference pattern that takes the appearance of a set of concentric rings. The interference pattern takes the appearance of a more uniform intensity distribution if the intensity distribution of the light beam 110' on the aperture 561 is more uniform. In particular, the sharpness of the rings depends on the reflectivity of the flats 563A, 563B of the etalon 563. Thus, if the reflectivity of the flats 563A, 563B is high (such that the etalon has a high quality (Q) factor), when the beam 110' is a monochromatic light beam, the etalon 563 produces a set of narrow bright rings against a dark background. To put it another way, even if two spectral components 574 of the light beam 110' are equally represented in the optical spectrum, the peak intensity of the respective interference pattern rings will not be equal unless the input light beam to the etalon 563 uniformly illuminates both of the corresponding ray directions. The transmission of the etalon 563 as a function of wavelength is shown in the resulting fringe pattern 571, which produces the optical spectrum 572 that is directed to the control system 185.

While the complete interference pattern is shown, it is not needed to perform the calculations or estimates; it is alternatively possible to generate only fringes within a region that is slightly larger than an active area of the sensor 550.

The sensor 550 receives and senses the output spatial components 574. The sensor 550 can be defined by a linear axis that indicates generally the active area of its sensing region. The linear axis of the sensing region can be perpendicular to the direction of propagation of the spatial components 574.

The sensor 550 can be a detector that receives and senses the output spatial components 574. For example, one type of suitable detector that can be used to measure along one dimension is a linear photodiode array. The linear photodiode array is consists of multiple elements of the same size, formed in a linear arrangement at an equal spacing in one package. The photodiode array is sensitive to the wavelengths contained in the light beam 110'; thus, if the light beam 110' has an optical spectrum containing only wavelengths in the deep ultraviolet range, then the photodiode array is sensitive to light having a wavelength in the deep ultraviolet range. As another example, the sensor 550 can be a two dimensional sensor such as a two-dimensional charged coupled device (CCD) or a two-dimensional complementary metal oxide semiconductor (CMOS) sensor. Again, if the light beam 110' has an optical spectrum containing only wavelengths in the deep ultraviolet range, then the two-dimensional sensor 550 is sensitive to light having a wavelength in the deep ultraviolet range. The sensor 550 should be able to read out data at a fast enough rate, for example, at about 6 kHz.

The control system 185 is connected to the output of the sensor 550 as well as the optical source 105 and the spectral feature selection system 130 that is optically coupled to the light beam 110. The control system 185 measures a property of the spatial components 574, and analyzes these measured properties to calculate an estimate of the spectral feature of the light beam 110. The control system 185 can perform the measurement, analysis, and calculation for each pulse of the light beam 110 or for a set of pulses of the light beam 110.

The property P that is measured can be a scalar quantity (which is fully described by a magnitude or numerical value) alone or a vector quantity (which is fully described by both a magnitude and a direction). An example of a scalar property P is a metric such as the width of the optical spectrum 572. In this example, it is possible that the entire shape of the optical spectrum 572 is not known but the metric is known and this is used to estimate the shape of the optical spectrum 572. An example of a vector property P is the entire waveform that describes the optical spectrum 572. In this example, one can calculate any metric from the entire spectrum and the by having the entire spectrum, one can make a more accurate calculation. The sensed spatial components can be measured for a range of one or more pulses of the pulsed light beam 110'.

The control system 185 can measure as the property P the width W of the optical spectrum 572. The width W of the optical spectrum 572 can provide an estimate of the bandwidth (the spectral feature) of the light beam 110'. In some implementations, the width W of the optical spectrum 572 is determined using a metric such as the FWXM (full width of the spectrum 572 at a fraction X of the maximum peak intensity). In other implementations, the width W of the optical spectrum 572 is determined using a metric such as EY (the width of the spectrum that contains a fraction Y of the integrated spectral intensity). Other metrics are suitable for measuring the property of the optical spectrum 572.

Figure 9:
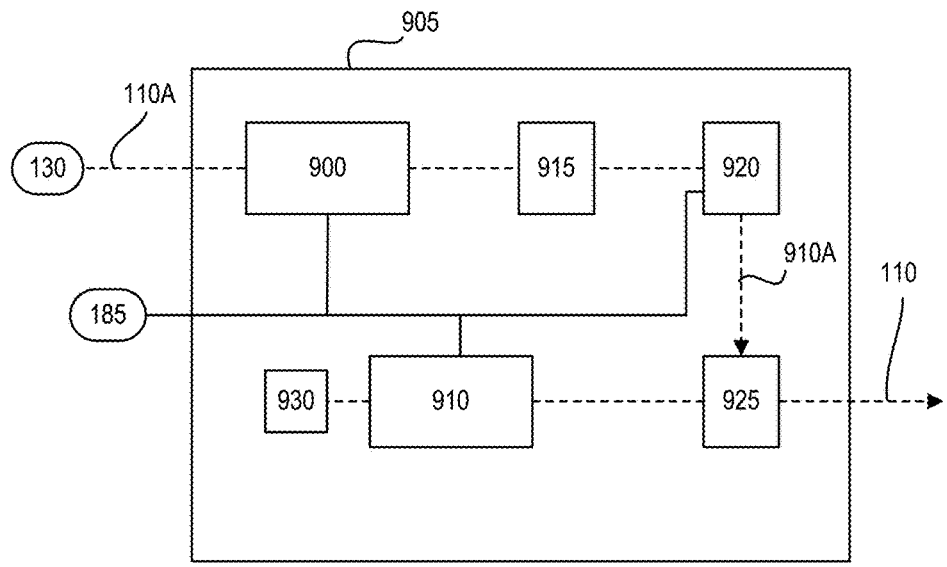
FIG. 9 is a block diagram of an exemplary optical source that can be used in the photolithography system of FIG. 1.

Referring to FIG. 9, in some implementations, the optical source 105 is an exemplary optical source 905. The optical source 905 is a pulsed laser source that produces a pulsed laser beam as the light beam 110. The optical source 905 is a two-stage laser system that includes a master oscillator (MO) 900 that provides a seed light beam 910A to a power amplifier (PA) 910. The master oscillator 900 typically includes a gain medium in which amplification occurs and an optical feedback mechanism such as an optical resonator. The power amplifier 910 typically includes a gain medium in which amplification occurs when seeded with the seed laser beam from the master oscillator 900. If the power amplifier 910 is designed as a regenerative ring resonator then it is described as a power ring amplifier (PRA) and in this case, enough optical feedback can be provided from the ring design. The spectral feature selection apparatus 130 receives the light beam 110A from the master oscillator 900 to enable fine tuning of spectral parameters such as the center wavelength and the bandwidth of the light beam 110A at relatively low output pulse energies. The power amplifier 910 receives the seed light beam 910A from the master oscillator 900 and amplifies this output to attain the necessary power for output to use in photolithography.

The master oscillator 900 includes a discharge chamber having two elongated electrodes, a laser gas that serves as the gain medium, and a fan circulating the gas between the electrodes. A laser resonator is formed between the spectral feature selection apparatus 130 on one side of the discharge chamber, and an output coupler 915 on a second side of the discharge chamber to output the seed light beam 910A to the power amplifier 910.

The optical source 905 can also include another spectral measurement module 920 that receives an output from the output coupler 915, and one or more beam modification optical systems 925 that modify the size and/or shape of the beam as needed. The spectral measurement module 920 is an example of another type of metrology system (such as the metrology system 170) that can be used to measure the wavelength (for example, the center wavelength) of the seed light beam 910A.

The power amplifier 910 includes a power amplifier discharge chamber, and if it is a regenerative ring amplifier, the power amplifier also includes a beam reflector or beam turning device 930 that reflects the light beam back into the discharge chamber to form a circulating path. The power amplifier discharge chamber includes a pair of elongated electrodes, a laser gas that serves as the gain medium, and a fan for circulating the gas between the electrodes. The seed light beam 910A is amplified by repeatedly passing through the power amplifier 910. The beam modification optical system 925 provides a way (for example, a partially-reflecting mirror) to in-couple the seed light beam 910A and to out-couple a portion of the amplified radiation from the power amplifier to form the output light beam 110.

The laser gas used in the discharge chambers of the master oscillator 900 and the power amplifier 910 can be any suitable gas for producing a laser beam around the required wavelengths and bandwidth. For example, the laser gas can be argon fluoride (ArF), which emits light at a wavelength of about 193 nm, or krypton fluoride (KrF), which emits light at a wavelength of about 248 nm.

The spectral measurement module 920 monitors the wavelength of the output (the seed light beam 910A) of the master oscillator 900. The spectral measurement module 920 can be placed at other locations within the optical source 905, or it can be placed at the output of the optical source 905.

The repetition rate of the pulses produced by the power amplifier 910 is determined by the repetition rate at which the master oscillator 900 is controlled by the control system 185, under the instructions from the controller 140 in the scanner 115. The repetition rate of the pulses output from the power amplifier 910 is the repetition rate seen by the scanner 115.

As discussed above, it is possible to control the bandwidth both coarsely and finely using only optical elements. On the other hand, it is possible to control the bandwidth in a fine and narrow range, and rapidly, by controlling a differential timing between the activation of the electrodes within the MO 900 and the PRA 910 while controlling the bandwidth in a coarse and wide range by adjusting the angle of a prism within the spectral feature selection system 130.

Figure 10:
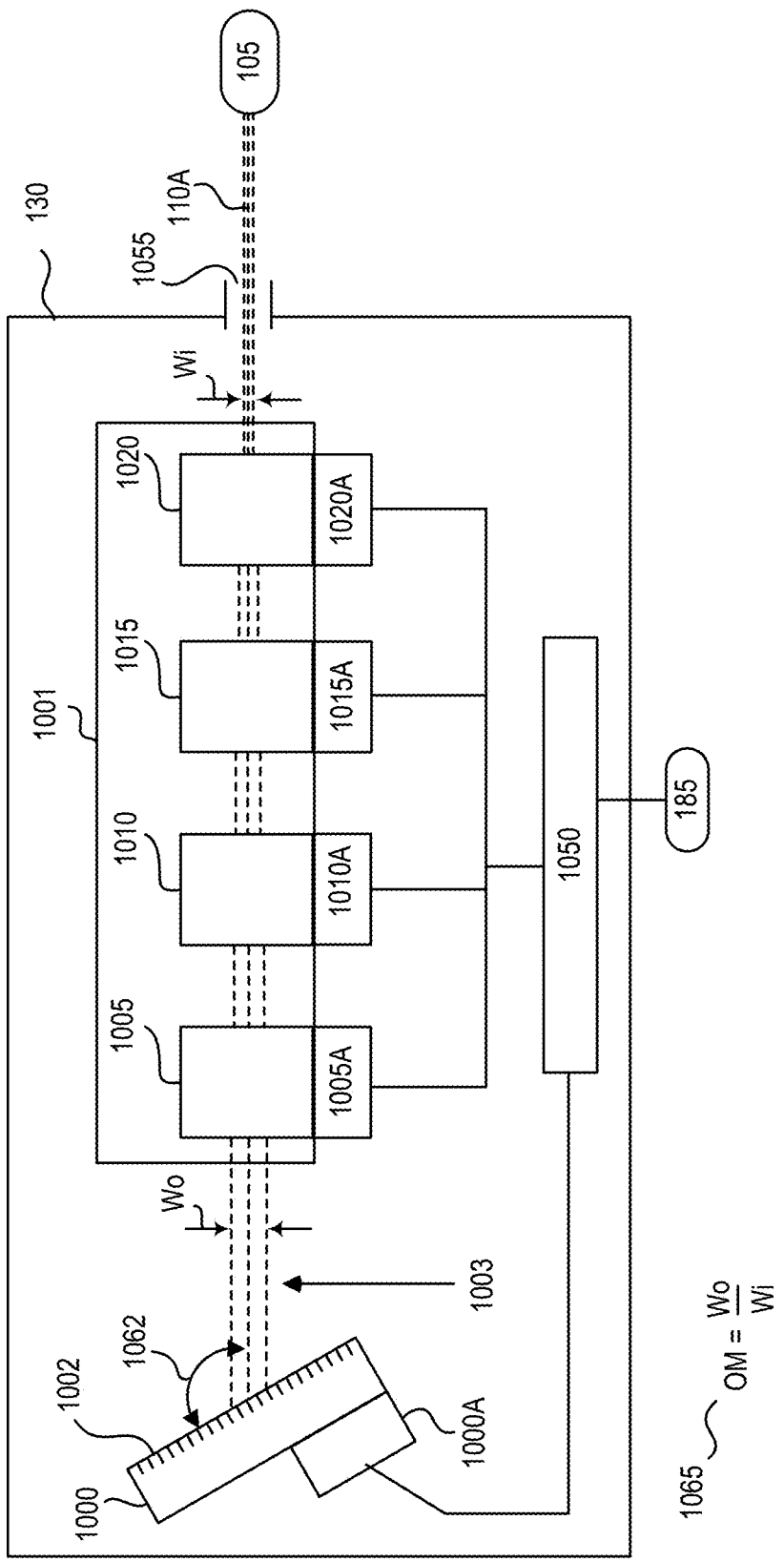
FIG. 10 is a block diagram of an exemplary spectral feature selection apparatus that can be used in the photolithography system of FIG. 1.

Referring to FIG. 10, in some implementations, the spectral feature selection apparatus 130 includes a set of optical features or components 1000, 1005, 1010, 1015, 1020 arranged to optically interact with the pulsed light beam 110A and a control module 1050 that includes electronics in the form of any combination of firmware and software. The optical components 1000, 1005, 1010, 1015, 1020 can be configured to provide a coarse spectral feature adjustment system; and, if the adjustment of such components is rapid enough, it can be configured to provide a fine spectral feature adjustment system. Although not shown in FIG. 10, it is possible for the spectral feature selection apparatus 130 to include other optical features or other non-optical features for providing fine spectral feature control.

The control module 1050 is connected to one or more actuation systems 1000A, 1005A, 1010A, 1015A, 1020A physically coupled to respective optical components 1000, 1005, 1010, 1015, 1020. The optical components of the apparatus 130 include a dispersive optical element 1000, which can be a grating, and a beam expander 1001 made of a set of refractive optical elements 1005, 1010, 1015, 1020, which can be prisms. The grating 1000 can be a reflective grating that is designed to disperse and reflect the light beam 110A; accordingly, the grating 1000 is made of a material that is suitable for interacting with a pulsed light beam 110A having a wavelength in the DUV range. Each of the prisms 1005, 1010, 1015, 1020 is a transmissive prism that acts to disperse and redirect the light beam 110A as it passes through the body of the prism. Each of the prisms can be made of a material (such as, for example, calcium fluoride) that permits the transmission of the wavelength of the light beam 110A. Although four refractive optical elements 1005, 1010, 1015, 1020 are shown, it is possible for fewer than four or more than four to be used in the beam expander 1001.

The pulsed light beam 110A enters the apparatus 130 through an aperture 1055, and then travels through the prism 1020, the prism 1010, and the prism 1005, in that order, prior to impinging upon a diffractive surface 1002 of the grating 1000. With each passing of the beam 110A through a consecutive prism 1020, 1015, 1010, 1005, the light beam 110A is optically magnified and redirected (refracted at an angle) toward the next optical component. The light beam 110A is diffracted and reflected from the grating 1000 back through the prism 1005, the prism 1010, the prism 1015, and the prism 1020, in that order, prior to passing through the aperture 1055 as the light beam 110A exits the apparatus 130. With each passing through the consecutive prisms 1005, 1010, 1015, 1020 from the grating 1000, the light beam 110A is optically compressed as it travels toward the aperture 1055.

The rotation of a prism (which can be any one of prisms 1005, 1010, 1015, or 1020) of the beam expander 1001 changes an angle of incidence at which the light beam 110A impinges upon the entrance surface of that rotated prism. Moreover, two local optical qualities, namely, an optical magnification and a beam refraction angle, of the light beam 110A through that rotated prism are functions of the angle of incidence of the light beam 110A impinging upon the entrance surface of that rotated prism. The optical magnification of the light beam 110A through the prism is the ratio of a transverse wide of the light beam 110A exiting that prism to a transverse width of the light beam 110A entering that prism.

A change in the local optical magnification of the light beam 110A at one or more of the prisms within the beam expander 1001 causes an overall change in the optical magnification OM 1065 of the light beam 110A through the beam expander 1001. The optical magnification OM 1065 of the light beam 110A through the beam expander 1001 is the ratio of the transverse width Wo of the light beam 110A exiting the beam expander 1001 to a transverse width Wi of the light beam 110A entering the beam expander 1001. Additionally, a change in the local beam refraction angle through one or more of the prisms within the beam expander 1001 causes an overall change in an angle of incidence of 1062 of the light beam 110A at the surface 1002 of the grating 1000.

The wavelength of the light beam 110A can be adjusted by changing the angle of incidence 1062 at which the light beam 110A impinges upon the diffractive surface 1002 of the grating 1000. The bandwidth of the light beam 110A can be adjusted by changing the optical magnification 1065 of the light beam 110.

The apparatus 130 is designed to adjust the wavelength of the light beam 110A that is produced within the resonator or resonators of the optical source 105 by adjusting an angle 1062 of incidence of at which the light beam 110A impinges upon the diffractive surface 1002 of the grating 1000. Specifically, this can be done by rotating one or more of the prisms 1005, 1010, 1015, 1020 and the grating 1000 to thereby adjust the angle of incidence 1062 of the light beam 110A.

Moreover, the bandwidth of the light beam 110A that is produced by the optical source 105 is adjusted by adjusting the optical magnification OM 1065 of the light beam 110A. Thus, the bandwidth of the light beam 110A can be adjusted by rotating one or more of the prisms 1005, 1010, 1015, 1020, which causes the optical magnification 1065 of the light beam 110A to change. Because the rotation of a particular prism causes a change in both the local beam refraction angle and the local optical magnification at that prism, the control of wavelength and bandwidth are coupled in this design.

Additionally, the bandwidth of the light beam 110A is relatively sensitive to the rotation of the prism 1020 and relatively insensitive to rotation of the prism 1005. This is because any change in the local optical magnification of the light beam 110A due to the rotation of the prism 1020 is multiplied by the product of the change in the optical magnification in the other prisms 1015, 1010, and 1005 because those prisms are between the rotated prism 1020 and the grating 1000, and the light beam 110A must travel through these other prisms 1015, 1010, 1005 after passing through the prism 1020. On the other hand, the wavelength of the light beam 110A is relatively sensitive to the rotation of the prism 1005 and relatively insensitive to the rotation of the prism 1020.

For example, in order to change the bandwidth without changing the wavelength, the optical magnification 1065 should be changed without changing the angle of incidence 1062, and this can be achieved by rotating the prism 1020 by a large amount and rotating the prism 1005 by a small amount.

The control module 1050 is connected to one or more actuation systems 1000A, 1005A, 1010A, 1015A, 1020A that are physically coupled to respective optical components 1000, 1005, 1010, 1015, 1020. Although an actuation system is shown for each of the optical components it is possible that some of the optical components in the apparatus 130 are either kept stationary or are not physically coupled to an actuation system. For example, in some implementations, the grating 1000 can be kept stationary and the prism 1015 can be kept stationary and not physically coupled to an actuation system.

Each of the actuation systems 1000A, 1005A, 1010A, 1015A, 1020A includes one or more actuators that are connected to its respective optical components. The adjustment of the optical components causes the adjustment in the particular spectral features (the wavelength and/or bandwidth) of the light beam 110A. The control module 1050 receives a control signal from the control system 185, the control signal including specific commands to operate or control one or more of the actuation systems. The actuation systems can be selected and designed to work cooperatively.

Each of the actuators of the actuation systems 1000A, 1005A, 1010A, 1015A, 1020A is a mechanical device for moving or controlling the respective optical component. The actuators receive energy from the module 1050, and convert that energy into some kind of motion imparted to the respective optical component. For example, the actuation systems can be any one of force devices and rotation stages for rotating one or more of prisms of a beam expander. The actuation systems can include, for example, motors such as stepper motors, valves, pressure-controlled devices, piezoelectric devices, linear motors, hydraulic actuators, voice coils, etc.

The grating 1000 can be a high blaze angle Echelle grating, and the light beam 110A incident on the grating 1000 at any angle of incidence 1062 that satisfies a grating equation will be reflected (diffracted). The grating equation provides the relationship between the spectral order of the grating 1000, the diffracted wavelength (the wavelength of the diffracted beam), the angle of incidence 1062 of the light beam 110A onto the grating 1000, the angle of exit of the light beam 110A diffracted off the grating 1000, the vertical divergence of the light beam 110A incident onto the grating 1000, and the groove spacing of the diffractive surface of the grating 1000. Moreover, if the grating 1000 is used such that the angle of incidence 1062 of the light beam 110A onto the grating 1000 is equal to the angle of exit of the light beam 110A from the grating 1000, then the grating 1000 and the beam expander (the prisms 1005, 1010, 1015, 1020) are arranged in a Littrow configuration and the wavelength of the light beam 110A reflected from the grating 1000 is the Littrow wavelength. It can be assumed that the vertical divergence of the light beam 110A incident onto the grating 1000 is near zero. To reflect the nominal wavelength, the grating 1000 is aligned, with respect to the light beam 110A incident onto the grating 1000, so that the nominal wavelength is reflected back through the beam expander (the prisms 1005, 1010, 1015, 1020) to be amplified in the optical source 105. The Littrow wavelength can then be tuned over the entire gain bandwidth of the resonators within optical source 105 by varying the angle of incidence 1062 of the light beam 110A onto the grating 1000.

Each of the prisms 1005, 1010, 1015, 1020 is wide enough along the transverse direction of the light beam 110A so that the light beam 110A is contained within the surface at which it passes. Each prism optically magnifies the light beam 110A on the path toward the grating 1000 from the aperture 1055, and therefore each prism is successively larger in size from the prism 1020 to the prism 1005. Thus, the prism 1005 is larger than the prism 1010, which is larger than the prism 1015, and the prism 1020 is the smallest prism.

As discussed above, the bandwidth of the light beam 110A is relatively sensitive to the rotation of the prism 1020 and relatively insensitive to rotation of the prism 1005. This is because any change in the local optical magnification of the light beam 110A due to the rotation of the prism 1020 is multiplied by the product of the change in the optical magnification in the other prisms 1015, 1010, and 1005 because those prisms are between the rotated prism 1020 and the grating 1000, and the light beam 110A must travel through these other prisms 1015, 1010, 1005 after passing through the prism 1020. On the other hand, the wavelength of the light beam 110A is relatively sensitive to the rotation of the prism 1005 and relatively insensitive to the rotation of the prism 1020. Thus, the wavelength can be coarsely changed by rotating the prism 1005, and the prism 1020 can be rotated (in a coarse manner). The angle of incidence 1062 of the light beam 110A is changed due to the rotation of the prism 1005 and the rotation of the prism 1020 offset the change in magnification caused by the rotation of the prism 1005. The prism 1020 can be used for coarse, large range, and slow bandwidth control. By contrast, the bandwidth can be controlled in a fine and narrow range and even more rapidly by controlling the prism 1010.

Figure 11:
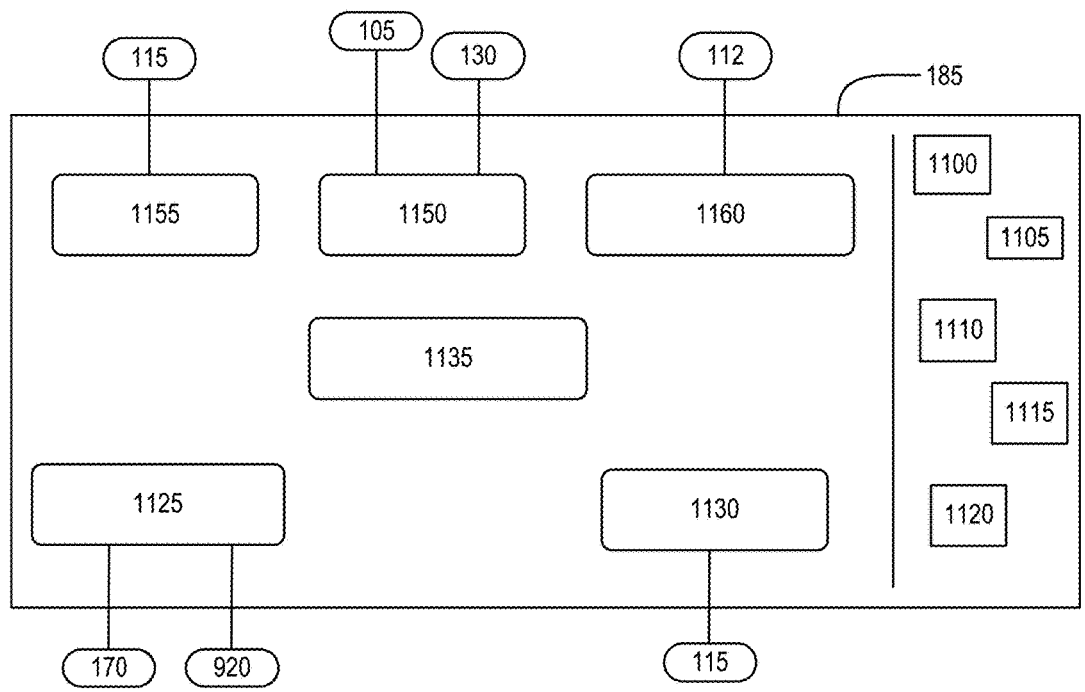
FIG. 11 is a block diagram of an exemplary control system that can be used in the photolithography system of FIG. 1.

Referring to FIG. 11, details about the control system 185 are provided that relate to the aspects of the system and method described herein. The control system 185 can include other features not shown in FIG. 11. In general, the control system 185 includes one or more of digital electronic circuitry, computer hardware, firmware, and software.

The control system 185 includes memory 1100, which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices;

magnetic disks such as internal hard disks and removable disks; magneto-optical disks; and CD-ROM disks. The control system 185 can also include one or more input devices 1105 (such as a keyboard, touch screen, microphone, mouse, hand-held input device, etc.) and one or more output devices 1110 (such as a speaker or a monitor).

The control system 185 includes one or more programmable processors 1115, and one or more computer program products 1120 tangibly embodied in a machine-readable storage device for execution by a programmable processor (such as the processors 1115). The one or more programmable processors 1115 can each execute a program of instructions to perform desired functions by operating on input data and generating appropriate output. Generally, the processor 1115 receives instructions and data from memory 1100. Any of the foregoing may be supplemented by, or incorporated in, specially designed ASICs (application-specific integrated circuits).

The control system 185 includes, among other components, a spectral feature analysis module 1125, a lithography analysis module 1130, a decision module 1135, a light source actuation module 1150, a lithography actuation module 1155, and a beam preparation actuation module 1160. Each of these modules can be a set of computer program products executed by one or more processors such as the processors 1115. Moreover, any of the modules 1125, 1130, 1135, 1150, 1155, 1160 can access data stored within the memory 1100.

The spectral feature analysis module 1125 receives the output from the metrology system 170 and the spectral measurement module 920. The lithography analysis module 1130 receives information from the lithography controller 140 of the scanner 115. The decision module 1135 receives the outputs from the analyses modules (such as the modules 1125 and 1130) and determines which actuation module or modules need to be activated based on the outputs from the analyses modules. The light source actuation module 1150 is connected to one or more of the optical source 105 and the spectral feature selection apparatus 130. The lithography actuation module 1155 is connected to the scanner 115, and specifically to the lithography controller 140. The beam preparation actuation module 1160 is connected to one or more components of the beam preparation system 112.

While only a few modules are shown in FIG. 11, it is possible for the control system 185 to include other modules. Additionally, although the control system 185 is represented as a box in which all of the components appear to be co-located, it is possible for the control system 185 to be made up of components that are physically remote from each other. For example, the light source actuation module 1150 can be physically co-located with the optical source 105 or the spectral feature selection apparatus 130.

In general, the control system 185 receives at least some information about the light beam 110 from the metrology system 170 and/or the spectral measurement module 920, and the spectral feature analysis module 1125 performs an analysis on the information to determine how to adjust one or more spectral features (for example, the bandwidth) of the light beam 110 supplied to the scanner 115. Based on this determination, the control system 185 sends signals to the spectral feature selection apparatus 130 and/or the optical source 105 to control operation of the optical source 105 via the control module 1050. In general, the spectral feature analysis module 1125 performs the analysis needed to estimate one or more spectral features (for example, the wavelength and/or the bandwidth) of the light beam 110. The output of the spectral feature analysis module 1125 is an estimated value of the spectral feature that is sent to the decision module 1135.

The spectral feature analysis module 1125 includes a comparison block connected to receive the estimated spectral feature and also connected to receive a spectral feature target value. In general, the comparison block outputs a spectral feature error value that represents a difference between the spectral feature target value and the estimated value. The decision module 1135 receives the spectral feature error value and determines how best to effect a correction to the system 100 in order to adjust the spectral feature. Thus, the decision module 1135 sends a signal to the light source actuation module 1150, which determines how to adjust the spectral feature selection apparatus 130 (or the optical source 105) based on the spectral feature error value. The output of the light source actuation module 1150 includes a set of actuator commands that are sent to the spectral feature selection apparatus 130. For example, the light source actuation module 1150 sends the commands to the control module 1050, which is connected to the actuation systems within the apparatus 1030.

Additionally, the lithography analysis module 1130 can receive instructions from the lithography controller 140 of the scanner 115 for example, to change one or more spectral features of the pulsed light beam 110 or to change a pulse repetition rate of the light beam 110. The lithography analysis module 1130 performs an analysis on these instructions to determine how to adjust the spectral features and sends the results of the analysis to the decision module 1135. The control system 185 causes the optical source 105 to operate at a given repetition rate. More specifically, the scanner 115 sends a trigger signal to the optical source 105 (by way of the control system (through the lithography analysis module 1130) for every pulse (that is, on a pulse-to-pulse basis) and the time interval between those trigger signals can be arbitrary, but when the scanner 115 sends trigger signals at regular intervals then the rate of those signals is a repetition rate. The repetition rate can be a rate requested by the scanner 115.

Figure 12:
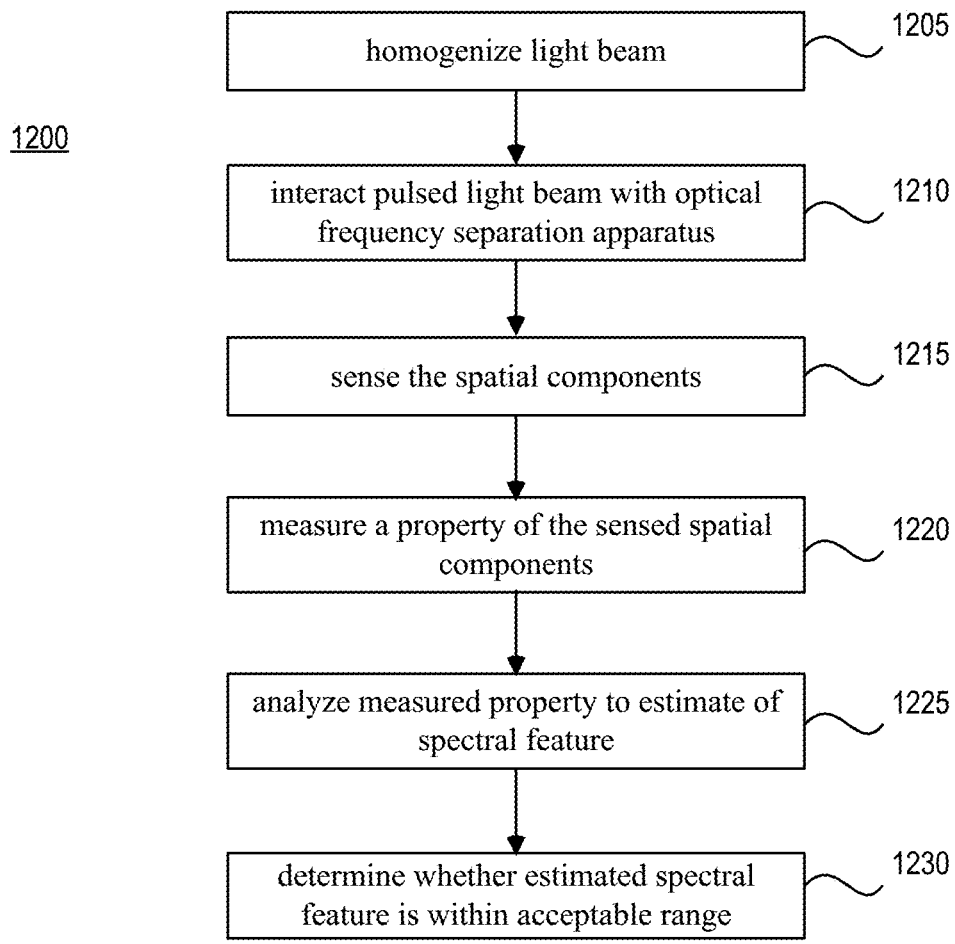
FIG. 12 is a flow chart of an exemplary procedure performed by the photolithography system of FIG. 1 to measure one or more spectral features of the pulsed light beam.

Referring to FIG. 12, a procedure 1200 is performed by the photolithography system 100 to estimate a spectral feature of the light beam 110'. The light beam 110' is homogenized (1205). As discussed above, the light beam 110' is homogenized by passing the light beam 110' through a pair of arrays of wavefront modification cells, with each cell having a surface area that matches a size of the spatial modes of the light beam 110'. In this way, each transverse spatial mode of the light beam 110' is projected to the same transverse area at a beam homogenization plane.

The homogenized light beam is interacted with an optical frequency separation apparatus (such as the etalon 563 within the metrology system 170 or an optical component within the spectral detection system 1410 of the spectral analysis module 920) that outputs spatial components that correspond to the spectral components of the light beam (1210). For example, the homogenized light beam is directed through the etalon 563, which transforms the spectral information (such as the wavelength) of the light beam 110' into spatial information. The outputted spatial components are sensed (1215), for example, by the sensor 550. The control system 185 receives the output of the sensor 550, and measures a property of the sensed spatial components (1220). The control system 185 analyzes the measured properties to estimate a spectral feature of the pulsed light beam (1225), determines whether the estimated spectral feature of the pulsed light beam is within an acceptable range of spectral features (1230).

Moreover, if the control system 185 determines that the estimated spectral feature of the pulsed light beam is outside the acceptable range (1230), then the control system 185 sends an adjustment signal to the spectral feature selection system 130 to modify the spectral feature of the pulsed light beam 110.

Other implementations are within the scope of the following claims. For example, in other implementations, the metrology system 170 includes other features not shown or discussed for measuring other aspects of the light beam 110. In other implementations, the microlenses 618A, 618B and the respective substrates 619A, 619B are made of fused silica, aluminum fluoride, encapsulated magnesium fluoride, gadolinium fluoride, or sodium aluminum fluoride.

Figure 13:
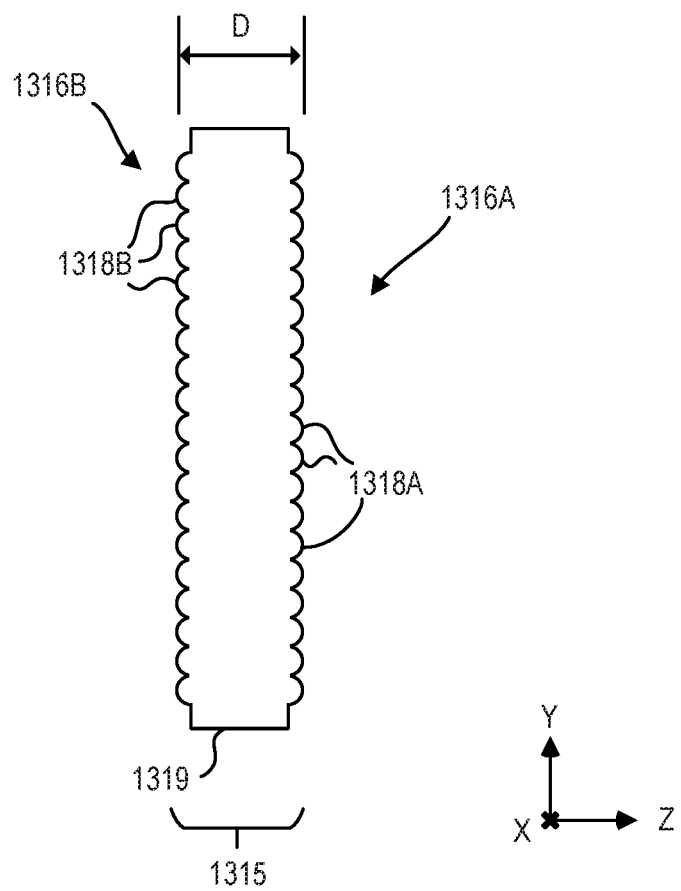
FIG. 13 is a block diagram of an exemplary wavefront modification device that can be used in the coherence-area matching apparatuses of any of the Figures.

Referring to FIG. 13, in another implementation, the coherence-area matching apparatus 515 includes, as the wavefront modification devices 516A and 516B, two microlens arrays 1316A, 1316B, and each microlens array 1316A, 1316B is applied to a single support substrate 1319. In this way, the curved or convex surfaces of the microlenses 1318A, 1318B of each microlens array can be facing away from each other (as shown in FIG. 13). In particular, if the microlenses 1318A, 1318B are plano-convex lenses, then the microlens arrays 1316A, 1316B can be oriented such that the plane surfaces of the microlenses 1318A of the microlens array 1316A are closest to the plane surfaces of the microlenses 1318B of the microlens array 1316B.

Figure 14:
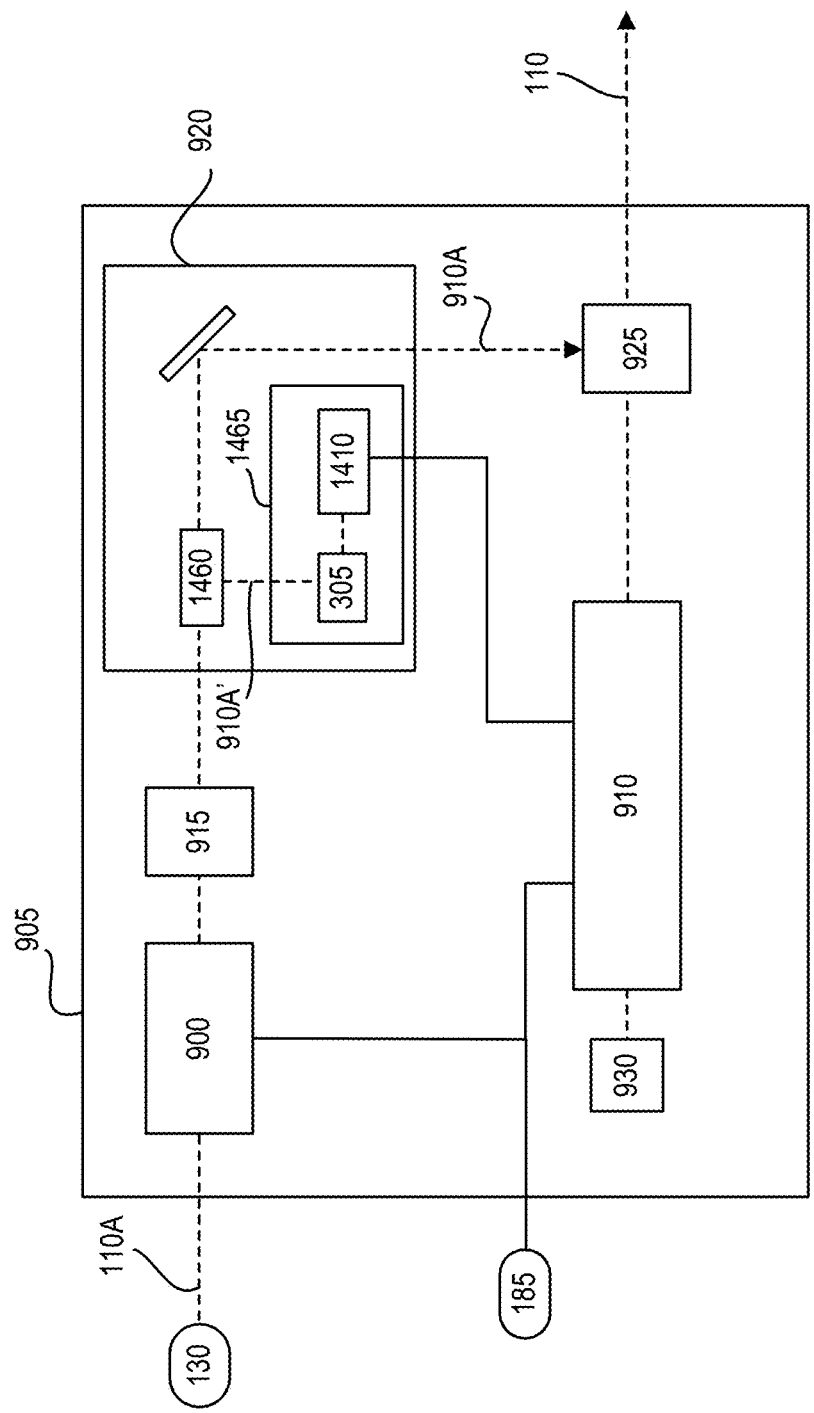
FIG. 14 is a block diagram of another implementation of the optical source that includes a beam homogenizer that includes the coherence-area matching apparatus and can be used in the photolithography system of FIG. 1.

With reference to FIG. 14, in other implementations, it is possible to use the coherence-area matching apparatus 315 or the entire beam homogenizer 305 to reduce the spatial coherence of the light beam 110 at other regions of the photolithography system 100. For example, the beam homogenizer 305 or just the coherence-area matching apparatus 315 could be placed in the path of a portion 910A' of the seed light beam 910A output from the master oscillator 900. In this implementation, the beam homogenizer 305 is configured to reduce the spatial coherence of the seed light beam portion 910A' directed to a spectral detection system 1410 within the spectral analysis module 920. The seed light beam portion 910A' is split off from the seed light beam portion 910A by a beam separator 1460, which directs the seed light beam portion 910A' toward a diagnostic apparatus 1465 that includes the spectral detection system 1410 and the beam homogenizer 305. In this example, the spectral detection system 1410 can be used to measure or detect a spectral feature such as the wavelength of the seed light beam portion 910A' for further diagnosis by the control system 185.

What is claimed is:
1. A metrology system for measuring a spectral feature of a pulsed light beam, the metrology system comprising:
    a beam homogenizer in the path of the pulsed light beam, the beam homogenizer including an array of wavefront modification cells, with each cell having a surface area that matches a size of at least one of the spatial modes of the light beam;

an etalon in the path of the pulsed light beam exiting the beam homogenizer, wherein the etalon is configured to interact with the pulsed light beam and to output a plurality of spatial components that correspond to the spectral components of the pulsed light beam; and at least one sensor that receives and senses the output spatial components.

2. The metrology system of claim 1, further comprising a control system connected to an output of the at least one sensor and configured to:

measure a property of the output spatial components from the etalon for one or more pulses;

analyze the measured property to calculate an estimate of the spectral feature of the pulsed light beam; and determine whether the estimated spectral feature of the pulsed light beam is within an acceptable range of values of spectral features.

3. The metrology system of claim 2, wherein the spectral feature is a bandwidth of the pulsed light beam.

4. The metrology system of claim 2, further comprising a spectral feature selection system optically connected to the pulsed light beam, wherein:

the control system is in communication with the spectral feature selection system; and if the control system determines that the estimated spectral feature of the pulsed light beam is outside the acceptable range, then the control system is configured to send an adjustment signal to the spectral feature selection system to modify the spectral feature of the pulsed light beam.

5. The metrology system of claim 1, wherein a cell surface area matches a mode size of the light beam if the cell surface area is between 0.5 and 1.5 times the area of the spatial mode.

6. The metrology system of claim 1, wherein a cell surface area matches a mode size of the light beam if the cell surface area is between 0.9 and 1.1 times the area of the spatial mode.

7. The metrology system of claim 1, further comprising an optical diffuser in the path of the light beam, wherein the beam homogenizer receives the light beam that is output from the optical diffuser.

8. The metrology system of claim 7, wherein the optical diffuser includes a microlens array.

9. The metrology system of claim 1, further comprising a beam separation device in the path between a source that produces the light beam and a photolithography exposure apparatus, wherein the beam separation device:

directs a first percentage of the light beam toward the beam homogenizer, and directs a second percentage of the light beam along the path toward the photolithography exposure apparatus.

10. The metrology system of claim 9, further comprising an optical temporal pulse stretcher between the beam separation device and the beam homogenizer.

11. The metrology system of claim 10, wherein the optical temporal pulse stretcher is a passive optical element.

12. The metrology system of claim 1, wherein the beam homogenizer comprises:

at least two arrays, each array having a plurality of wavefront modification cells; and a lens that receives the light beam output of the at least two arrays.

13. The metrology system of claim 12, wherein the homogenized beam plane is at the focal plane of the lens.

14. The metrology system of claim 13, further comprising a spinning diffuser at the homogenized beam plane.

15. The metrology system of claim 13, wherein the lens has a focal length that is large enough so that the spacing between diffraction spikes of the output light beam from the at least two arrays is greater than an area of the at least one sensor that receives the output light beam from the beam homogenizer.

16. The metrology system of claim 12, further comprising an actuator connected to one or more of the at least two arrays, and configured to adjust a distance between the at least two arrays.

17. The metrology system of claim 1, wherein the beam homogenizer cell array is made of calcium fluoride, fused silica, aluminum fluoride, encapsulated magnesium fluoride, gadolinium fluoride, or sodium aluminum fluoride.

18. The metrology system of claim 1, wherein the beam homogenizer cell array comprises an array of lenslets.

19. The metrology system of claim 1, wherein the beam homogenizer cell array is a transmissive cell array.

20. The metrology system of claim 1, wherein the light beam has a plurality of wavelengths, at least some being in the deep ultraviolet range.

21. The metrology system of claim 1, wherein the size of the spatial mode of the light beam corresponds to a transverse area across the light beam in which all points within the transverse area have a fixed phase relationship.

22. The metrology system of claim 1, wherein the beam homogenizer is in the path of a pulsed light beam output from a power amplifier of an optical source.

23. The metrology system of claim 1, wherein the beam homogenizer is in the path of a pulsed seed light beam output from a master oscillator of an optical source.

* * * * *